US012813209B2

(12) United States Patent
Mitsuyoshi

(10) Patent No.: US 12,813,209 B2
(45) Date of Patent: Nov. 24, 2026

(54) SUBSTRATE TREATING APPARATUS

(71) Applicant: SCREEN Holdings Co., Ltd., Kyoto (JP)

(72) Inventor: Ichiro Mitsuyoshi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 518 days.

(21) Appl. No.: 18/472,829

(22) Filed: Sep. 22, 2023

(65) Prior Publication Data

US 2024/0105483 A1 Mar. 28, 2024

(30) Foreign Application Priority Data

Sep. 22, 2022 (JP) ................................ 2022-151708

(51) Int. Cl.
*H10P 72/00* (2026.01)
*H10P 72/10* (2026.01)
(Continued)

(52) U.S. Cl.
CPC ...... *H10P 72/3211* (2026.01); *H10P 72/0404* (2026.01); *H10P 72/15* (2026.01);
(Continued)

(58) Field of Classification Search
CPC .. H10P 72/3211; H10P 72/0404; H10P 72/15; H10P 72/3206; H10P 72/3306;
(Continued)

(56) References Cited

U.S. PATENT DOCUMENTS 6,074,515 A 6/2000 Iseki et al. .................... 156/345
2002/0081181 A1* 6/2002 Yokomori ........... H10P 72/3412
414/416.02

(Continued)

FOREIGN PATENT DOCUMENTS

CN 114334711 A 4/2022
JP H10-270524 A 10/1998

(Continued)

OTHER PUBLICATIONS

Extended European Search Report dated Mar. 7, 2024 issued in corresponding European Patent Application No. 23198324.8.

(Continued)

*Primary Examiner* — Aiden Lee
(74) *Attorney, Agent, or Firm* — OSTROLENK FABER LLP

(57) ABSTRACT

Disclosed is a substrate treating apparatus. In the substrate treating apparatus, a pusher is provided at a position accessible by a first transport mechanism, and a posture turning unit is provided at a position accessible by a center robot. A second transport mechanism receives substrates in a vertical posture held by the pusher, and delivers the substrates to the posture turning unit. The second transport mechanism includes two horizontal chucks configured to hold the substrates in the vertical posture while radially supporting two side portions of each of the substrates. The posture turning unit includes an upper and lower chucks for radially supporting an upper portion and a lower portion of each of the substrates in the vertical posture held by the two horizontal chucks to receive the substrates in the vertical posture from the two horizontal chucks, and upper and lower chuck rotation unit for rotating the upper and lower chucks around a horizontal axis.

11 Claims, 18 Drawing Sheets

(51) Int. Cl.
*H10P 72/30* (2026.01)
*H10P 72/76* (2026.01)

(52) U.S. Cl.
CPC ...... *H10P 72/3206* (2026.01); *H10P 72/3306* (2026.01); *H10P 72/3312* (2026.01); *H10P 72/7618* (2026.01); *H10P 72/7621* (2026.01)

(58) Field of Classification Search
CPC ............. H10P 72/3312; H10P 72/7618; H10P 72/7621; H10P 72/3412; H10P 72/0414; H10P 72/0416; H10P 72/0426; H10P 72/0456; H10P 72/3311
See application file for complete search history.

(56) References Cited

U.S. PATENT DOCUMENTS

| | | | | |
|---|---|---|---|---|
| 2002/0146309 | A1* | 10/2002 | Di Cesare | H10P 72/3412 414/416.08 |
| 2003/0017034 | A1* | 1/2003 | Davis | H10P 72/3311 414/217 |
| 2004/0187342 | A1 | 9/2004 | Izuta | 34/467 |
| 2006/0137726 | A1 | 6/2006 | Sano et al. | 134/61 |
| 2010/0068014 | A1* | 3/2010 | Mitsuyoshi | B65G 25/04 414/226.04 |
| 2015/0332940 | A1 | 11/2015 | Wang et al. | |
| 2018/0090358 | A1 | 3/2018 | Miyamoto | |
| 2021/0111038 | A1 | 4/2021 | Kanagawa et al. | |

FOREIGN PATENT DOCUMENTS

| | | | |
|---|---|---|---|
| JP | H10-335425 | A | 12/1998 |
| JP | 2006-147779 | A | 6/2006 |
| JP | 2011-238945 | A | 11/2011 |
| JP | 2016-502275 | A | 1/2016 |
| JP | 2018-056341 | A | 4/2018 |
| JP | 2021-064652 | A | 4/2021 |
| JP | 2022-077161 | A | 5/2022 |
| TW | 200902415 | A | 1/2009 |
| TW | 201020194 | A | 6/2010 |

OTHER PUBLICATIONS

Decision of Rejection dated Oct. 14, 2025 for corresponding Korean Patent Application No. 10-2023-0122910 and its English translation.

Office Action dated Aug. 29, 2024 for corresponding Taiwanese Patent Application No. 112135826.

Notice of Allowance dated Feb. 3, 2026 issued in corresponding Japanese Patent Application No. 2022-151708 and its English translation.

* cited by examiner

SUBSTRATE TREATING APPARATUS

CROSS-REFERENCE TO RELATED APPLICATIONS

This application claims priority to Japanese Patent Application No. 2022-151708 filed Sep. 22, 2022, the subject matter of which is incorporated herein by reference in entirety.

TECHNICAL FIELD

The present invention relates to a substrate treating apparatus configured to perform treatment on substrates. Examples of substrates include semiconductor substrates, substrates for flat panel displays (FPDs), glass substrates for photomasks, substrates for optical disks, substrates for magnetic disks, ceramic substrates, and substrates for solar cells. Examples of the FPDs include liquid crystal display devices and organic electroluminescence (EL) display devices.

BACKGROUND ART

Examples of currently-used substrate treating apparatus include a substrate treating apparatus of a hybrid type provided with a batch-type processing module (batch processing unit) configured to perform treatment on a plurality of substrates collectively, and a single-wafer-type processing module (single-wafer processing unit) configured to perform treatment on the substrates treated by the batch-type processing module one by one. See, for example, Japanese Patent Publication (Translation of PCT Application) No. 2016-502275 and Japanese Unexamined Patent Publication No. 2021-064652.

The batch-type processing module performs treatment on a plurality of substrates in a vertical posture collectively, whereas the single-wafer-type processing module performs treatment on substrates in a horizontal posture one by one. Accordingly, in order for the single-wafer-type processing module to perform treatment on the substrates processed by the batch-type processing module, the substrate treating apparatus further includes a rotating mechanism configured to turn a posture of the substrates from vertical to horizontal.

Japanese Patent Publication (Translation of PCT Application) 2016-502275 discloses a rotating mechanism (posture turning mechanism) provided with a pedestal and two side walls for surrounding outer edges of substrates. The pedestal has a plurality of grooves for placing the substrates vertically. The two side walls each have a group of supporting portions protruding inward.

The two side walls are open when the rotating mechanism receives a plurality of substrates in the vertical posture from a vertical substrate transporting robot (batch substrate transport mechanism). Thereafter, the vertical substrate transporting robot places the substrates in the grooves of the pedestal vertically. Then, the two side walls are folded to grip the substrates. Then, the pedestal is rotated by 90 degrees around a horizontal axis orthogonal to a direction where the substrates in the vertical posture are aligned. Thereby, the substrates are arranged horizontally within the rotating mechanism and are supported by the supporting portions of the two side walls.

Moreover, Japanese Unexamined Patent Publication No. 2021-064652 discloses a substrate treating apparatus provided with a main transport mechanism (batch substrate transport mechanism), a pusher, and a posture turning mechanism (posture turning unit). Japanese Unexamined Patent Publication No. 2018-056341 discloses a substrate treating apparatus provided with a posture turning mechanism.

SUMMARY OF INVENTION

Technical Problem

The rotating mechanism disclosed in Japanese Patent Publication (Translation of PCT Application) 2016-502275 rotates the pedestal by 90 degrees around the horizontal axis orthogonal to the direction where the substrates in the vertical posture are aligned, thereby turning the substrates to horizontal. Then, a horizontal substrate transporting robot (single-wafer substrate transport mechanism) takes substrates from between the two side walls for transporting the substrates to the single-wafer module. At this time, it is sometimes hard for the horizontal substrate transporting robot to receive the substrates in a horizontal posture when the rotating mechanism receives the substrates in a vertical posture from the vertical substrate transporting robot (batch substrate transport mechanism) at a position far apart from the horizontal substrate transporting robot.

Moreover, the posture turning mechanism (posture turning unit) disclosed in Japanese Unexamined Patent Publication No. 2018-056341 receives substrates from a main transport mechanism (batch substrate transport mechanism) via a pusher. In this regard, it is sometimes preferred that the posture turning mechanism receives the substrates from the main transport mechanism directly.

The present invention has been made regarding the state of the art noted above, and its one object is to provide a substrate treating apparatus where a single-wafer substrate transport mechanism can easily access a plurality of substrates which a posture turning unit receives from a batch substrate transport mechanism and whose posture is turned horizontal by the posture turning unit.

Solution to Problem

The present invention is constituted as stated below to achieve the above object. One aspect of the present invention provides a substrate treating apparatus for successively performing batch treatment for processing a plurality of substrates collectively and single-wafer treatment for processing the substrates one by one. The substrate treating apparatus includes: a batch process tank configured to process the plurality of substrates collectively, a first batch substrate transport mechanism configured to transport the substrates in a vertical posture collectively to the batch process tank, a single-wafer processing chamber configured to perform treatment on the substrates one by one, a single-wafer substrate transport mechanism configured to transport the substrates in a horizontal posture one by one to the single-wafer processing chamber, and a posture turning mechanism configured to turn a posture of the substrates in the vertical posture, on which the batch treatment is performed, to the horizontal posture. The posture turning mechanism includes: a substrate holder that is provided at a position accessible by the first batch substrate transport mechanism, and is configured to receive the substrates in the vertical posture, on which the batch treatment is performed, from the first batch substrate transport mechanism collectively and hold the substrates, a posture turning unit that is provided at a position accessible by the single-wafer substrate transport mechanism and configured to turn a posture of the substrates from vertical to horizontal collectively, and a second batch substrate transport mechanism that is movable between the substrate holder and the posture turning unit and configured to receive the substrates in the vertical posture held by the substrate holder and deliver the substrates to the posture turning unit. The second batch substrate transport mechanism includes two horizontal chucks configured to hold the substrates in the vertical posture while radially supporting two lateral side portions on an outer edge of each of the substrates in the vertical posture held by the substrate holder. The posture turning unit includes an upper chuck and a lower chuck capable of radially supporting an upper portion and a lower portion on the outer edge of each of the substrates in the vertical posture held by the two horizontal chucks to receive the substrates in the vertical posture from the two horizontal chucks, and an upper and lower chuck rotation unit configured to rotate the upper chuck and the lower chuck around a horizontal axis orthogonal to an alignment direction of the substrates in the vertical posture held by the upper chuck and the lower chuck for turning a posture of the substrates received from the two horizontal chucks from vertical to horizontal. The single-wafer substrate transport mechanism takes the substrates, held by the upper chuck and the lower chuck, in the horizontal posture one by one, and transports the taken substrates to the single-wafer processing chamber.

With the substrate treating apparatus according to the aspect of the present invention, the upper chuck and the lower chuck of the posture turning unit support the upper portion and the lower portion on the outer edge of each of the substrates in the vertical posture held by the two horizontal chucks of the second batch substrate transport mechanism. Accordingly, the posture turning unit can receive the substrates directly from the two horizontal chucks of the second batch substrate transport mechanism. Moreover, the substrate holder is provided at a position accessible by the first batch substrate transport mechanism, and the posture turning unit is provided at a position accessible by the single-wafer substrate transport mechanism. Accordingly, the second batch substrate transport mechanism can transport the substrates from the substrate holder to the posture turning unit even when the substrate holder receives the substrates from the first batch substrate transport mechanism at a position far away from the single-wafer substrate transport mechanism. Accordingly, the single-wafer substrate transport mechanism can easily access the posture turning unit.

Moreover, it is preferred in the aspect of the substrate treating apparatus described above that the two horizontal chucks each have a plurality of V-shaped holding grooves for holding the substrates in the vertical posture individually, that the upper chuck has a plurality of first horizontal guide grooves each having a width larger than a thickness of the substrates for housing the outer edge of each of the substrates, and that the lower chuck has a plurality of second horizontal guide grooves each having a width larger than the thickness of the substrates for housing the outer edge of each of the substrates.

The two horizontal chucks can hold the substrates in the vertical posture with the V-shaped holding grooves, achieving prevention of contact of two adjacent substrates. This can prevent damages on the substrates, for example. Moreover, the first horizontal guide grooves and the second horizontal guide grooves each have the width larger than the thickness of the substrates. Accordingly, since a space is generated for lifting the substrates when the posture of the substrates is turned to horizontal and then the single-wafer substrate transport mechanism takes the substrates from the upper chuck and the lower chuck, the substrates can be taken with no load thereon.

Moreover, it is preferred in the aspect of the substrate treating apparatus described above that the posture turning unit further includes two auxiliary chucks provided on both sides of the lower chuck along a circumferential direction of the substrates, that the two auxiliary chucks each include a plurality of second V-shaped holding grooves for holding the substrates in the vertical posture, that the two auxiliary chucks each house the outer edges of the substrates in the second V-shaped holding grooves for holding the substrates in the vertical posture when the upper chuck and the lower chuck hold the substrates in the vertical posture, and that the two auxiliary chucks each take the substrates from the second V-shaped holding grooves and move apart from the substrates to a position where the single-wafer substrate transport mechanism is not prevented from taking of the substrates when the upper chuck and the lower chuck hold the substrates in the horizontal posture.

When the upper chuck and the lower chuck hold the substrates in the vertical posture, the two auxiliary chucks in a closed state hold the substrates in the vertical posture, achieving prevention of contact of two adjacent substrates. Moreover, the two auxiliary chucks are in an opened state when the substrates in the horizontal posture are taken from the upper chuck and the lower chuck without preventing taking of the substrates by the single-wafer substrate transport mechanism.

Moreover, it is preferred in the aspect of the substrate treating apparatus described above that the posture turning unit further includes a relative moving unit configured to move the two auxiliary chucks relatively to the upper chuck and the lower chuck in an alignment direction where the substrates are aligned, that the first horizontal guide grooves have a plurality of mounting surfaces on which the substrates in the horizontal posture are placed individually, and that, when the posture turning unit turns a posture of the substrates to horizontal, the relative moving unit moves the two auxiliary chucks relatively such that the substrates in the vertical posture held by the second V-shaped holding grooves are brought into contact to the mounting surfaces individually. This can suppress particles generated when the substrates are moved and contact in posture turning.

Moreover, it is preferred in the aspect of the substrate treating apparatus described above that the posture turning mechanism further includes a stand-by tank configured to store a liquid in which the substrates held by the substrate holders are immersed. If the substrates are dried before the dry treatment in the single-wafer processing chamber, substrate pattern collapse occurs. However, the present invention can prevent drying of the substrates held by the substrate holder.

Moreover, it is preferred in the aspect of the substrate treating apparatus described above that the posture turning mechanism further includes a holder nozzle configured to supply a liquid in a shower state or in a mist state to the substrates held by the substrate holder. If the substrates are dried before the dry treatment in the single-wafer processing chamber, substrate pattern collapse occurs. However, the present invention can prevent drying of the substrates held by the substrate holder.

Moreover, it is preferred in the aspect of the substrate treating apparatus described above that the posture turning mechanism further includes a posture turning nozzle configured to supply a liquid in a shower state or in a mist state to the substrates held by the upper chuck and the lower chuck of the posture turning unit. If the substrates are dried before the dry treatment in the single-wafer processing chamber, substrate pattern collapse occurs. However, the present invention can prevent drying of the substrates held by the upper chuck and the lower chuck of the posture turning unit.

Moreover, it is preferred in the aspect of the substrate treating apparatus described above that the posture turning mechanism further includes a rotator configured to rotate the substrate holder around a vertical axis. The substrates in any directions can be delivered to the second batch substrate transport mechanism. In addition, the substrates in the horizontal posture after posture turning can be brought into any directions.

Moreover, it is preferred in the aspect of the substrate treating apparatus described above that the batch process tank and the posture turning mechanism are arranged in a horizontal first direction, and that the second batch substrate transport mechanism transports the substrates from the substrate holder in a horizontal second direction orthogonal to the first direction. When the batch process tank and its surrounding components are elongated in the second direction, the single-wafer substrate transport mechanism is sometimes hard to access. Here, the second batch substrate transport mechanism can move in the second direction, whereby the posture turning unit can approach the single-wafer substrate transport mechanism. Accordingly, the single-wafer substrate transport mechanism can transport the substrates easily.

Moreover, it is preferred in the substrate treating apparatus described above that the two horizontal chucks are each provided with two or more V-shaped holding grooves configured to hold two or more substrates set in advance from the substrates, and that the second batch substrate transport mechanism pulls out the two or more substrates from the substrates in the vertical posture held by the substrate holder with use of the two horizontal chucks. The second batch substrate transport mechanism can pull out the two or more substrates from the substrates held by the substrate holder, and transport the two or more substrates.

Moreover, it is preferred in the substrate treating apparatus described above that the second batch substrate transport mechanism can switch the two horizontal chucks between a first pattern and a second pattern, that, when the two horizontal chucks have the first pattern, the second batch substrate transport mechanism pulls out one or more substrates, set in advance, from the substrates in the vertical posture held by the substrate holder, and that, when the two horizontal chucks have the second pattern, the second batch substrate transport mechanism pulls out one or more substrates, set in advance and different from the one or more substrates pulled out with the first pattern, from the substrates in the vertical posture held by the substrate holder. The second batch substrate transport mechanism can pull out and transport one or more substrates, different from one or more substrates pulled out with the different pattern, from the substrates held by the substrate holder.

Advantageous Effects of Invention

With the substrate treating apparatus according to the present invention, the single-wafer substrate transport mechanism can easily access to a plurality of substrates which the posture turning unit receives from the batch substrate transport mechanism and whose posture is turned horizontal.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIRST EMBODIMENT

Figure 1:
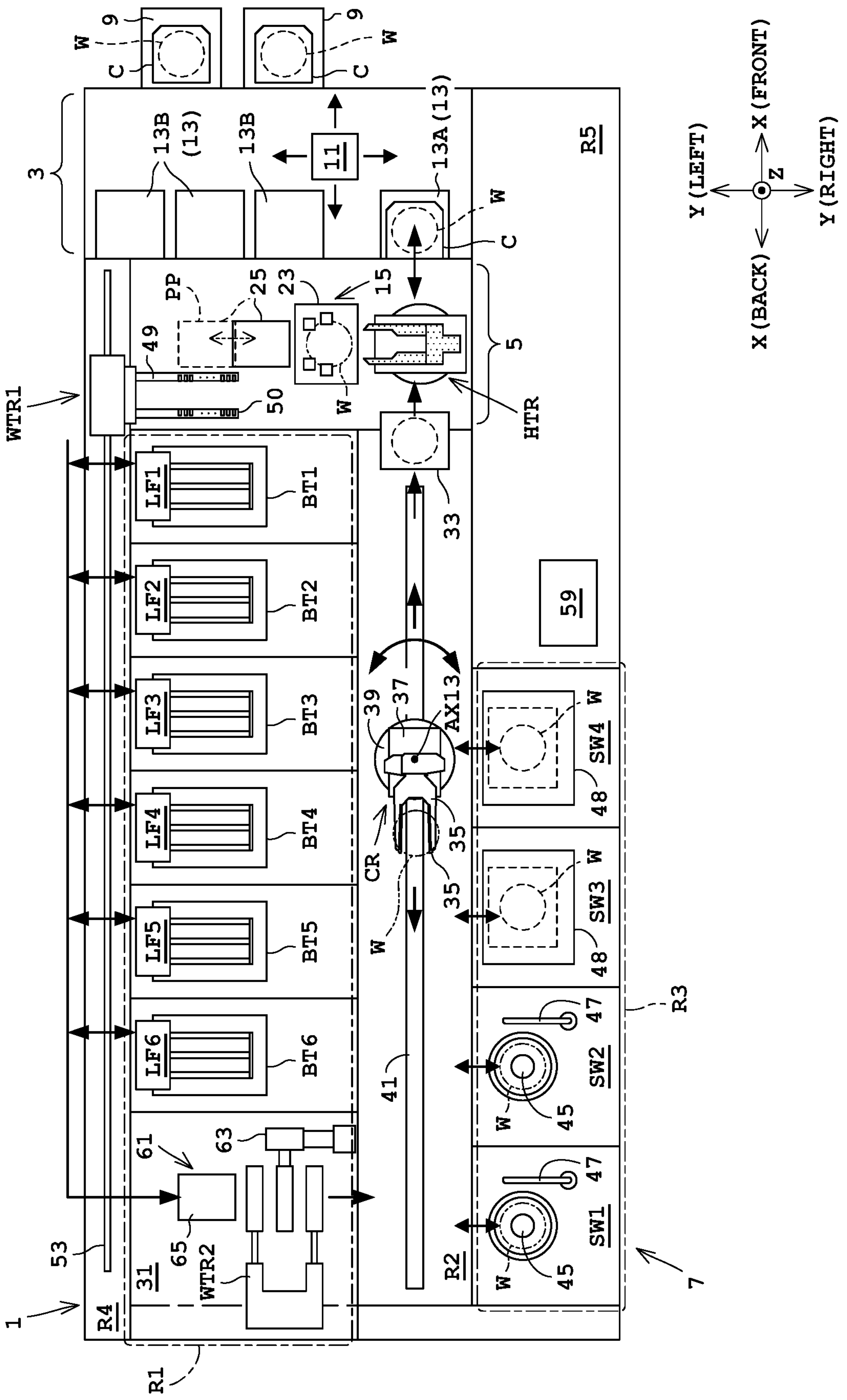
FIG. 1 is a plan view schematically illustrating a configuration of a substrate treating apparatus according to a first embodiment of the present invention.
Figure 2:
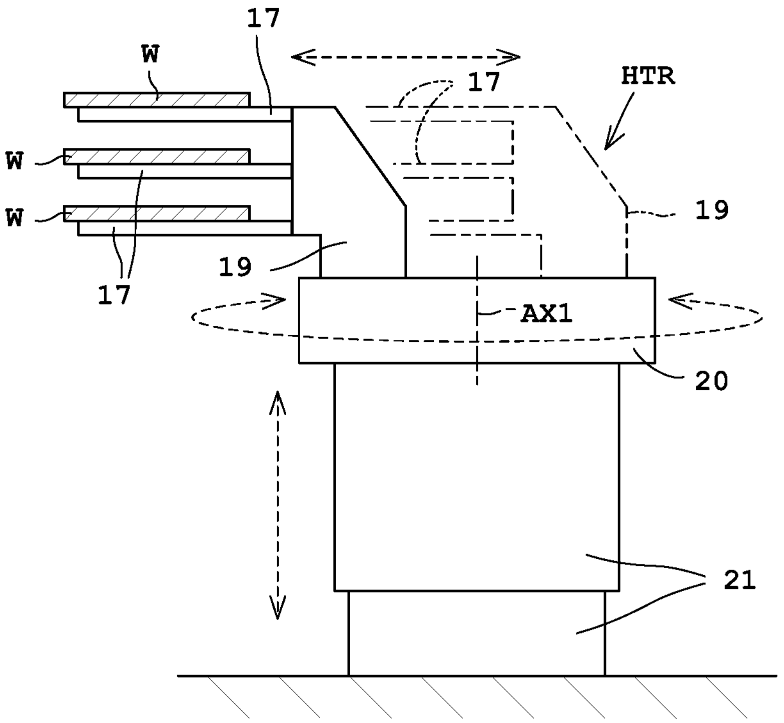
FIG. 2 is a side view of a collective transport mechanism.

A first embodiment of the present invention will now be described with reference to the drawings. FIG. 1 is a plan view schematically illustrating a configuration of a substrate treating apparatus 1 according to a first embodiment of the present invention. FIG. 2 is a side view of a collective transport mechanism HTR. FIGS. 3A to 3F are each a side view for explanation of a posture turning unit and a pusher mechanism in a transferring block.

1. Overall Configuration

Reference is made to FIG. 1. A substrate treating apparatus 1 includes a stocker block 3, a transferring block 5, and a treating block 7. The stocker block 3, the transferring block 5, and the treating block 7 are arranged in this order in a horizontal direction.

The substrate treating apparatus 1 performs chemical liquid treatment, cleaning treatment, dry treatment, and the like, for example, on the substrates W. The substrate treating apparatus 1 performs batch treatment and single-wafer treatment to substrates W. That is, the substrate treating apparatus 1 performs the batch treatment to the substrates W, and then performs the single-wafer treatment to the substrates W. The batch treatment is a process system of performing treatment collectively on a plurality of substrates W. The batch treatment is a process system of performing treatment collectively on a plurality of substrates W.

In the present specification, the direction in which stocker block, the stocker block 3, the transferring block 5, and the treating block 7 are arranged is referred to as a "front-back direction X" for convenience. The front-back direction X is horizontal. One direction of the front-back direction X from the transferring block 5 to the stocker block 3 is referred to as "forward". The direction opposite to the forward direction is referred to as "rearward". A horizontal direction orthogonal to the front-back direction X is referred to as a "transverse direction Y". Moreover, one direction of the transverse direction Y is referred to as a "rightward direction" appropriately. The direction opposite to the rightward direction is referred to as "leftward". The perpendicular direction relative to the horizontal direction is referred to as a "vertical direction Z". For reference, the drawings show front, rear, right, left, up, and down, as appropriate, for example.

2. Stocker Block

The stocker block 3 accommodates at least one carrier C. One or more (e.g., two) load ports 9 are provided in the stocker block 3. The stocker block 3 includes a carrier transport mechanism (robot) 11 and shelves 13.

The carrier transport mechanism 11 transports the carrier C between the load port 9 and the shelf 13. The carrier transport mechanism 11 includes a gripper configured to grip a projected portion on an upper face of the carrier C, or a hand configured to support the carrier C while contacting a bottom face of the carrier C. The shelf 13 is classified into a shelf 13A for taking and housing the substrates W and a shelf 13B for storage.

The shelf 13A adjoins the transferring block 5. The shelf 13A may be provided with a mechanism for attaching and detaching a lid of the carrier C. At least one shelf 13A is provided. The shelf 13A places the carrier C thereon. The carrier C accommodates a plurality of (e.g., twenty-five) substrates W in a horizontal posture at a predetermined pitch (e.g., a pitch of 10 mm) in the vertical direction Z. Here, the substrates W are aligned in a thickness direction thereof. A front opening unify pod (FOUP) is used as the carrier C. The FOUP is a sealing container. The carrier C may be an opened container, which type is not specified.

3. Transferring Block

The transferring block 5 adjoins rearward X of the stocker block 3. The transferring block 5 includes a collective transport mechanism (substrate handling mechanism) HTR and a first posture turning mechanism 15.

The collective transport mechanism (robot) HTR is provided rightward Yin the transferring block 5. The collective transport mechanism HTR transports a plurality of (e.g., twenty-five) substrates W in a horizontal posture collectively. The collective transport mechanism HTR takes and accommodates the substrates W collectively from and into the carrier C placed on the shelf 13A. Moreover, the collective transport mechanism HTR is configured to deliver the substrates W collectively to and from the first posture turning mechanism 15 and to and from a buffer unit 33 mentioned later. That is, the collective transport mechanism HTR can transport the substrates W among the carrier C placed on the shelf 13A, the first posture turning mechanism 15, and the buffer unit 33.

Reference is made to FIG. 2. The collective transport mechanism HTR includes a plurality of (e.g., twenty-five) hands 17. In FIG. 2, the collective transport mechanism HTR includes three hands 17 for convenience of illustration. The hands 17 each hold one substrate W.

Moreover, the collective transport mechanism HTR includes a hand supporting portion 19, an advancing and withdrawing portion 20, and a lifting and rotating portion 21. The hand supporting portion 19 supports a plurality of hands 17. Accordingly, the hands 17 are moved integrally. The advancing and withdrawing portion 20 causes the hands 17 to advance and withdraw via the hand supporting portion 19. The lifting and rotating portion 21 rotates the advancing and withdrawing portion 20 around a vertical axis AX1, thereby rotating the hands 17 and the like around the vertical axis AX1. Moreover, the lifting and rotating portion 21 moves the advancing and withdrawing portion 20 upward and downward, thereby moving the hands 17 and the like upward and downward. The lifting and rotating portion 21 is fixed on the floor. That is, the lifting and rotating portion 21 does not move in the horizontal direction. Here, the advancing and withdrawing portion 20 and the lifting and rotating portion 21 each include an electric motor. Here, the collective transport mechanism HTR may include another hand, not shown, for transporting one substrate W in addition to the hands 17 and the hand supporting portion 19.

Reference is made to FIG. 1. The first posture turning mechanism 15 turns a posture of the substrates W collectively from horizontal to vertical. The first posture turning mechanism 15 includes a posture turning unit 23 and a pusher mechanism 25. In FIG. 1, the collective transport mechanism HTR, the posture turning unit 23, and the pusher mechanism 25 are arranged leftward Y in this order. FIGS. 3A to 3F are each a view illustrating the first posture turning mechanism 15.

Figure 3A:
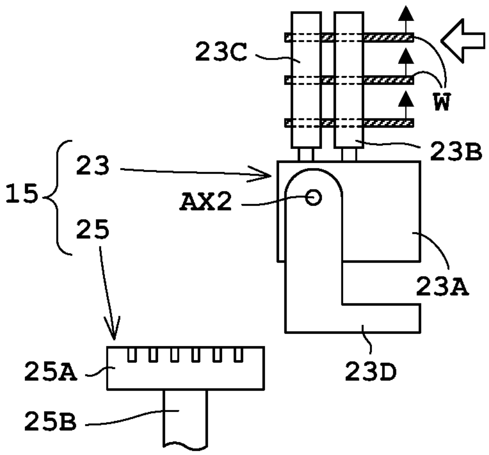
FIGS. 3A to 3F are each a side view for explanation of a posture turning unit and a pusher mechanism in a transferring block.

As shown in FIGS. 1 and 3A, the posture turning unit 23 includes a support base 23A, one-paired horizontal holders 23B, one-paired vertical holders 23C, and a rotation driving portion 23D. The one-paired horizontal holders 23B and the one-paired vertical holders 23C are provided on the support base 23A. The horizontal holders 23B and the vertical holders 23C receive the substrates W transported by the collective transport mechanism HTR. When the substrates W are in the horizontal posture, the one-paired horizontal holders 23B support the substrates W from below while contacting a lower face of each of the substrates W. In contrast to this, when the substrates W are in the vertical posture, the one-paired vertical holders 23C hold the substrates W.

The rotation driving portion 23D supports the support base 23A rotatably around a horizontal axis AX2. Moreover, the rotation driving portion 23D rotates the support base 23A around the horizontal axis AX2, whereby a posture of the substrates W held by the holders 23B and 23C is turned from horizontal to vertical.

Figure 3B:
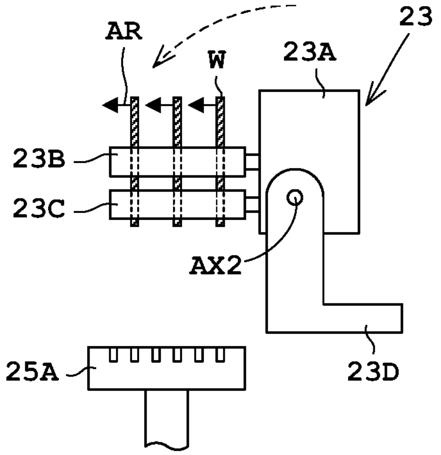
Figure 3C:
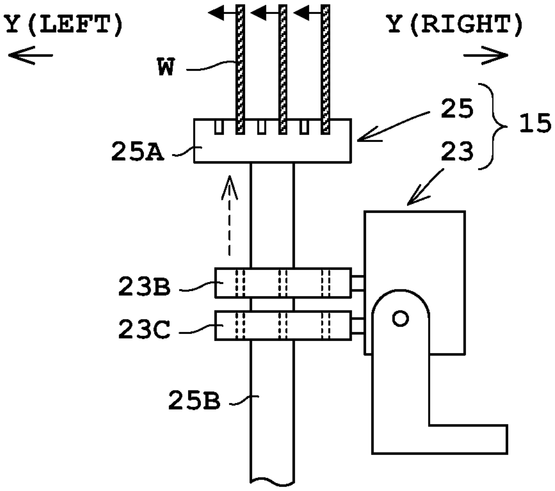
Figure 3D:
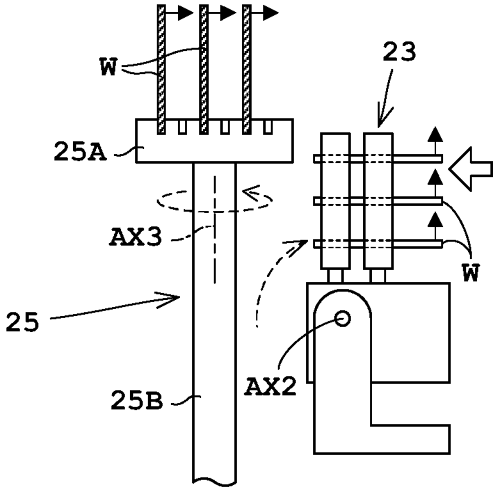
Figure 3E:
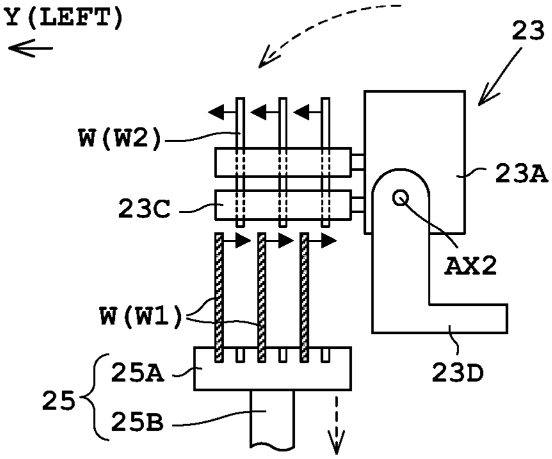
Figure 3F:
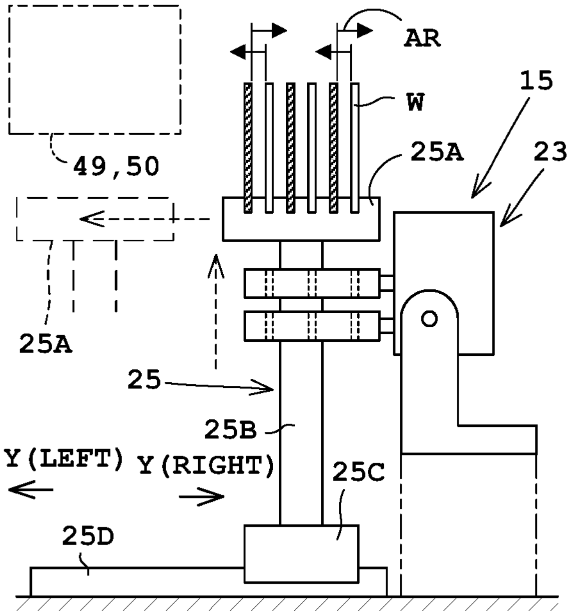

As illustrated in FIGS. 1 and 3F, the pusher mechanism 25 includes a pusher 25A, a lifting and rotating portion 25B, a horizontally moving portion 25C, and a rail 25D. The pusher 25A supports each lower part of plurality of (e.g., fifty) substrates W in the vertical posture. Here in FIGS. 3A to 3F, the pusher 25A is configured so as to be able to support six substrates W for convenience of illustration.

The lifting and rotating portion 25B is connected to a lower face of the pusher 25A. The lifting and rotating portion 25B expands and contracts, thereby moving the pusher 25A in the up-down direction. Moreover, the lifting and rotating portion 25B rotates the pusher 25A around a vertical axis AX3. The horizontally moving portion 25C supports the lifting and rotating portion 25B. The horizontally moving portion 25C moves the pusher 25A and the lifting and rotating portion 25B horizontally along the rail 25D. The rail 25D is formed so as to extend in the transverse direction Y. The rotation driving portion 23D, the lifting and rotating portion 25B, and the horizontally moving portion 25C each include an electric motor.

Description is now made of operation of the first posture turning mechanism 15. Batch process tanks BT1 to BT6, mentioned later, in the treatment block 7 each perform treatment on fifty substrates W for two carriers C, for example, collectively. The first posture turning mechanism 15 turns a posture of the fifty substrates W by twenty-five. Moreover, the first posture turning mechanism 15 arranges the substrates W at a predetermined pitch (e.g., a half pitch) in a face-to-face system. Here, a half pitch is a pitch of 5 mm, for example. The pusher mechanism 25 transports the fifty substrates W to a first transport mechanism WTR1.

Here, twenty-five substrates W in a first carrier C are to be described as substrates W1 in a first substrate group. Twenty-five substrates W in a second carrier C are to be described as substrates W2 in a second substrate group. Moreover, description is made in FIGS. 3A to 3F that the number of substrates W1 in the first substrate group is three, and the number of substrates W2 in the second substrate group is three for convenience of illustration. Moreover, when no particular distinction is made between the substrate W1 and the substrate W2, the substrate W1 and the substrate W2 are described as a "substrate W".

Reference is made to FIG. 3A. The posture turning unit 23 receives twenty-five substrates W1 in the first substrate group, that are transported by the collective transport mechanism HTR, with the holders 23B, 23C. At this time, the twenty-five substrates W1 are in a horizontal posture, and device faces thereof are directed upward. The twenty-five substrates W1 are arranged at a predetermined pitch (full pitch). Here, a full pitch is a pitch of 10 mm, for example. The full pitch is also called a normal pitch.

Here, a half pitch is half the full pitch. Moreover, the device face of the substrate W (W1, W2) is a face where electronic circuits are formed, and is called a "front face". Moreover, a back face of the substrate W is a face where no electronic circuits are formed. A face opposite to the device face corresponds to the back face.

Reference is made to FIG. 3B. The posture turning unit 23 rotates the holders 23B, 23C by 90 degrees around a horizontal axis AX2 to turn a posture of the twenty-five substrates W1 from horizontal to vertical. Reference is made to FIG. 3C. The pusher mechanism 25 moves the pusher 25A upward to a position higher than the holders 23B, 23C of the posture turning unit 23. Accordingly, the pusher 25A receives the twenty-five substrates W from the holders 23B, 23C. The twenty-five substrates W1 held by the pusher 25A are directed leftward Y. Here in FIGS. 3A to 3F, a direction of the device face of the substrate W is denoted by an arrow AR.

Reference is made to FIG. 3D. The pusher mechanism 25 rotates the twenty-five substrates W in the vertical posture by 180 degrees around the vertical axis AX3. Accordingly, the twenty-five substrates W1 are reversed to be directed rightward Y. Moreover, the reversed twenty-five substrates W1 are moved leftward Y from a position before the reverse by a half pitch (e.g., 5 mm). Moreover, the holders 23B, 23C of the posture turning unit 23 are rotated by −90 degrees around the horizontal axis AX2 such that next substrates W2 are receivable. Thereafter, the posture turning unit 23 receives twenty-five substrates W2 in a second substrate group, that are transported from the collective transport mechanism HTR, with the holders 23B, 23C. At this time, the twenty-five substrates W2 are in a horizontal posture, and device faces thereof are directed upward. Here, the posture turning unit 23 and the pusher mechanism 25 operate so as not to interfere each other.

Reference is made to FIG. 3E. The pusher mechanism 25 moves downward the pusher 25A, holding the twenty-five substrates W1 in the first substrate group, to a retreating position. Thereafter, the posture turning unit 23 turns a posture of the twenty-five substrates W2 from horizontal to vertical. The twenty-five substrates W2 whose posture is turned are directed leftward Y. Reference is made to FIG. 3F. Thereafter, the pusher mechanism 25 moves upward the pusher 25A, holding the twenty-five substrates W2 in the second substrate group. Accordingly, the pusher mechanism 25 also receives the twenty-five substrates W2 from the posture turning unit 23.

Accordingly, the pusher 25A holds fifty substrates W (W1, W2) in the first substrate group and the second substrate group. For the fifty substrates W, the twenty-five substrates W1 and the twenty-five substrates W2 are alternately arranged one by one. The fifty substrates W are arranged at a half pitch (e.g., 5 mm). Moreover, the twenty-five substrates W1 are directed in a reverse direction to the twenty-five substrates W2. Consequently, the fifty substrates W are arranged in a face-to-face system. That is, for adjacent two substrates W1, W2, two device faces thereof (or two back faces) face each other.

Thereafter, the pusher mechanism 25 moves the pusher 25A, holding the fifty substrates W, to a substrate delivery position PP below one-paired chucks 49, 50 of the first transport mechanism WTR1 along the rail 25D.

4. Treating Block 7

The treating block 7 adjoins the transferring block 5. The treating block 7 is located rearward X of the transferring block 5. The treating block 7 includes a batch treatment region R1, a single-wafer transportation region R2, a single-wafer treatment region R3, and a batch substrate transport region R4. The substrate treating apparatus 1 further includes an electrical parts installation region R5.

4-1. Batch Treatment Region R1

The batch treatment region R1 adjoins the transferring block 5, the single-wafer transportation region R2, and the batch substrate transport region R4. Moreover, the batch treatment region R1 is provided between the single-wafer transportation region R2 and the batch substrate transport region R4. The batch treatment region R1 has a first end side adjoining the transferring block 5, and a second end side extending in a direction so as to be apart from the transferring block 5, i.e., rearward X.

The batch treatment region R1 contains six batch process tanks BT1 to BT6 and a second posture turning mechanism 31, for example. The six batch process tanks BT1 to BT6 are arranged in line in the front-back direction X where the batch treatment region R1 extends. Moreover, the second posture turning mechanism 31 is provided opposite to the transferring block 5 across the six batch process tanks BT1 to BT6. That is, the six batch process tanks BT1 to BT6 are arranged between the transferring block 5 and the second posture turning mechanism 31. Moreover, the second posture turning mechanism 31 (pusher mechanism 61) is arranged on an extension line of the six batch process tanks BT1 to BT6. Note that the number of batch process tanks is not limited to six, and the number only needs to be plural.

The six batch process tanks BT1 to BT6 each perform immersion treatment on a plurality of substrates W in the vertical posture collectively. For example, the six batch process tanks BT1 to BT6 is formed by four chemical liquid process tanks BT1 to BT4 and two water cleaning process tanks BT5 and BT6. Specifically, the two chemical liquid process tanks BT1 and BT2 and the water cleaning process tank BT5 are set as one pair. Then, the two chemical liquid process tanks BT3 and BT4 and the water cleaning process tank BT6 are set as another pair.

The four chemical liquid process tanks BT1 to BT4 each perform etching treatment with chemical. A phosphoric acid liquid is used as the chemical, for example. The chemical liquid process tank BT1 stores the chemical supplied from a chemical liquid jet pipe, not shown. The chemical liquid jet pipe is provided in an inner wall of the chemical liquid process tank BT1. The three chemical liquid process tanks BT2 to BT4 are each configured in the same manner as the chemical liquid process tank BT1.

The two water cleaning process tanks BT5 and BT6 each perform deionized water cleaning treatment by cleaning off the chemical, adhered to the substrates W, with pure water. The deionized water is, for example, deionized water (DIW). The two water cleaning process tanks BT5 and BT6 each store deionized water supplied from a cleaning liquid jet pipe, not shown. The cleaning liquid jet pipe is provided in inner walls of the water cleaning process tanks BT5 and BT6.

The six batch process tanks BT1 to BT6 contain six lifters LF1 to LF6, respectively. For example, the lifter LF1 holds the substrates W arranged at a predetermined pitch (half pitch) in the vertical posture. Moreover, the lifter LF1 moves the substrates W upward and downward between a treating position inside of the batch process tank (chemical liquid process tank) BT1 and a delivery position above the batch process tank BT1. The other lifters LF2 to LF6 is configured in the same manner as the lifter LF1.

The second posture turning mechanism 31 collectively turns a posture of the substrates W, on which batch treatment is performed, from vertical to horizontal entirely or partially. Detailed description is made later of the second posture turning mechanism 31.

4-2. Single-Wafer Transportation Region R2

The single-wafer transportation region R2 adjoins the transferring block 5, the batch treatment region R1, the single-wafer treatment region R3, and the electrical parts installation region R5. Moreover, the single-wafer transportation region R2 is provided between the batch treatment region R1 and the single-wafer treatment region R3. The single-wafer transportation region R2 has a first end side adjoining the transferring block 5. Moreover, the single-wafer transportation region R2 has a second end side extending in a direction so as to be apart from the transferring block 5, i.e., rearward X.

The single-wafer transportation region R2 contains a center robot CR and the buffer unit 33. The center robot CR transports the substrates among the second posture turning mechanism 31, single-wafer processing chambers SW1 to SW4, mentioned later, and the buffer unit 33. For example, the center robot CR transports the substrates W in the horizontal posture one by one to the single-wafer processing chambers SW1 to SW4 individually. The center robot CR corresponds to the single-wafer substrate transport mechanism in the present invention.

The center robot CR includes two hands 35, an advancing and withdrawing portion 37, a lifting and rotating portion 39, and a horizontally moving unit 41 (including a guide rail). The two hands 35 each hold one substrate W in a horizontal posture.

The advancing and withdrawing portion 37 supports the hands 35 movably, and moves the hands 35 forward and rearward individually. The lifting and rotating portion 39 rotates the hands 35 and the advancing and withdrawing portion 37 around a vertical axis AX13. Moreover, the lifting and rotating portion 39 moves the hands 35 and the advancing and withdrawing portion 37 upward and downward. The guide rail is provided on a floor of the single-wafer transportation region R2 along a direction where the single-wafer transportation region R2 extends. The horizontally moving unit 41 moves the hands 35, the advancing and withdrawing portion 37 and the like along the guide rail in the front-back direction X. Here, the advancing and withdrawing portion 37, the lifting and rotating portion 39, and the horizontally moving unit 41 each include an electric motor.

For example, the advancing and withdrawing portion 37 moves the two hands 35 forward to take the substrates W from the second posture turning mechanism 31. Then, the advancing and withdrawing portion 37 may move one of the hands 35, holding one substrate W, forward to transport the one substrate W to one of the single-wafer processing chambers. Here, the center robot CR may include one hand 35 or three or more hands 35. When the center robot CR includes three or more hands 35, the center robot CR moves the three or more hands 35 forward and rearward individually.

The buffer unit 33 includes a plurality of mount shelves. The mount shelves are in a horizontal posture. Each of the mount shelves is capable of placing one substrate W thereon. The buffer unit 33 places the substrates W in the horizontal posture at a predetermined pitch (full pitch) in the vertical direction Z. That is, the mount shelves are arranged at a predetermined pitch (full pitch) in the vertical direction Z. The buffer unit 33 is configured so as to place at least twenty-five substrates W that the collective transport mechanism HTR can transport. The buffer unit 33 is configured to be capable of placing fifty substrates W, for example.

Here as specifically shown in FIG. 1, the buffer unit 33 is arranged across the transferring block 5 and the single-wafer transportation region R2. That is, the buffer unit 33 is provided on a boundary between the transferring block 5 and the single-wafer transportation region R2. Moreover, the buffer unit 33 may be provided in either the transferring block 5 or the single-wafer transportation region R2 only.

Accordingly, the buffer unit 33 only need to be provided fixedly in any of the boundary between the transferring block 5 and the single-wafer transportation region R2, the transferring block 5, or the single-wafer transportation region R2. Since the buffer unit 33 is not moved but is provided fixedly, the buffer unit 33 and its surrounding components can be configured simply.

4-3. Single-Wafer Treatment Region R3

The single-wafer treatment region R3 adjoins the single-wafer transportation region R2 and the electrical parts installation region R5. The single-wafer treatment region R3 has a first end side positioned close to the transferring block 5 via the electrical parts installation region R5. In the electrical parts installation region R5, electric circuits and a controller 59, mentioned later, necessary for the substrate treating apparatus 1 are provided. Moreover, the single-wafer treatment region R3 has a second end side extending in a direction so as to be apart from the transferring block 5, i.e., rearward X. Moreover, the single-wafer treatment region R3 is provided along the batch treatment region R1 and the single-wafer transportation region R2.

A plurality of (e.g., four) single-wafer processing chambers SW1 to SW4 are provided in the single-wafer treatment region R3. The four single-wafer processing chambers SW1 to SW4 are arranged in the front-back direction X where the single-wafer treatment region R3 extends. The single-wafer processing chambers SW1 to SW4 are each configured to perform treatment on the substrates W one by one. A first single-wafer processing chamber SW1 is positioned farthest from the transferring block 5. A second single-wafer processing chamber SW2 is arranged forward X of the first single-wafer processing chamber SW1. A third single-wafer processing chamber SW3 is arranged forward X of the second single-wafer processing chamber SW2. A fourth single-wafer processing chamber SW4 is arranged forward X of the third single-wafer processing chamber SW3. The single-wafer processing chambers SW1 to SW4 may be formed in plural steps. For example, twelve single-wafer processing chambers may be arranged four in the front-back direction X (horizontal direction) by three in the vertical direction Z.

For example, the single-wafer processing chambers SW1, SW2 each include a rotating unit 45 and a nozzle 47. The rotating unit 45 includes a spin chuck configured to hold one substrate W in a horizontal posture, and an electric motor configured to rotate the spin chuck around a vertical axis passing through the center of the substrate W. The spin chuck may hold a lower face of the substrate W by vacuum adsorption. Moreover, the spin chuck includes three or more chuck pins for gripping an outer edge of the substrate W.

The nozzle 47 supplies a treatment liquid to the substrate W held by the rotating unit 45. The nozzle 47 moves between a standby position apart from the rotating unit 45 and a supply position above the rotating unit 45. Isopropyl alcohol (IPA) or deionized water is used, for example, as the treatment liquid. The single-wafer processing chambers SW1, SW2 may each perform cleaning treatment on the substrates W with deionized water, and then perform preliminary dry treatment with IPA, or may form an IPA liquid film on top faces of the substrates W, for example.

The single-wafer processing chambers SW3, SW4 each perform dry treatment with supercritical fluid, for example. A carbon dioxide liquid is used as the fluid, for example. The single-wafer processing chambers SW3, SW4 each include a chamber body (vessel) 48, a supporting tray, and a lid. The chamber body 48 includes a treating space provided therein, an opening through which the substrates W enter, a supply port, and an exhaust port. The substrates W are accommodated into the treating space while being supported by the support tray. The lid closes the opening of the chamber body 48. For example, the single-wafer processing chambers SW3, SW4 each make the fluid into a supercritical state and supply the supercritical fluid from the supply port into the treating space of the chamber body 48. At this time, gas within the treating space of the chamber body 48 is exhausted from the exhaust port. By the supercritical fluid supplied into the treating space, dry treatment is performed on the substrates W.

The supercritical state is obtained by bringing fluid into critical temperature and pressure inherent in the fluid. Specifically, when the fluid is carbon dioxide, a critical temperature is 31 degrees and critical pressure is 7.38 MPa. Under the supercritical state, the fluid has a surface tension of approximately zero. Accordingly, patterns of the substrate W are not affected by a gas-liquid interface. Consequently, pattern collapse is unlikely to occur in the substrate W.

4-4. Batch Substrate Transport Region R4

The batch substrate transport region R4 adjoins the transferring block 5 and the batch treatment region R1. The batch substrate transport region R4 is provided along the batch treatment region R1. The batch substrate transport region R4 extend in the front-back direction X. The four regions R1, R2, R3, R4 are provided so as to extend in parallel to one another.

The batch substrate transport region R4 has the first transport mechanism (robot) WTR1. That is, the batch substrate transport region R4 is provided with the first transport mechanism WTR1. The first transport mechanism WTR1 transports a plurality of (e.g., fifty) substrates W collectively among the substrate delivery position PP defined in the transferring block 5, any of the six batch process tanks BT1 to BT6, for example, and the second posture turning mechanism 31.

The first transport mechanism WTR1 includes the one-paired chucks 49, 50, and a guide rail 53. The chucks 49, 50 each have fifty holding grooves for holding fifty substrates W individually, for example. The two chucks 49, 50 extend in parallel in the Y-direction in plan view (FIG. 1). The first transport mechanism WTR1 makes the two chucks 49, 50 opened or closed. The first transport mechanism WTR1 moves the one-paired chucks 49, 50, along the guide rail 53. The first transport mechanism WTR1 is driven by an electric motor. Here, the first transport mechanism WTR1 corresponds to the first batch substrate transport mechanism in the present invention.

5: Controller

The substrate treating apparatus 1 includes the controller 59 and a memory unit (not shown). The controller 59 controls components of the substrate treating apparatus 1. The controller 59 includes one or more processors like a central processing unit (CPU). The memory unit includes, for example, at least one of a read-only memory (ROM), a random-access memory (RAM), and a hard disk. The memory unit stores computer programs necessary for controlling each component of the substrate treating apparatus 1.

6. Second Posture Turning Mechanism

Figure 4A:
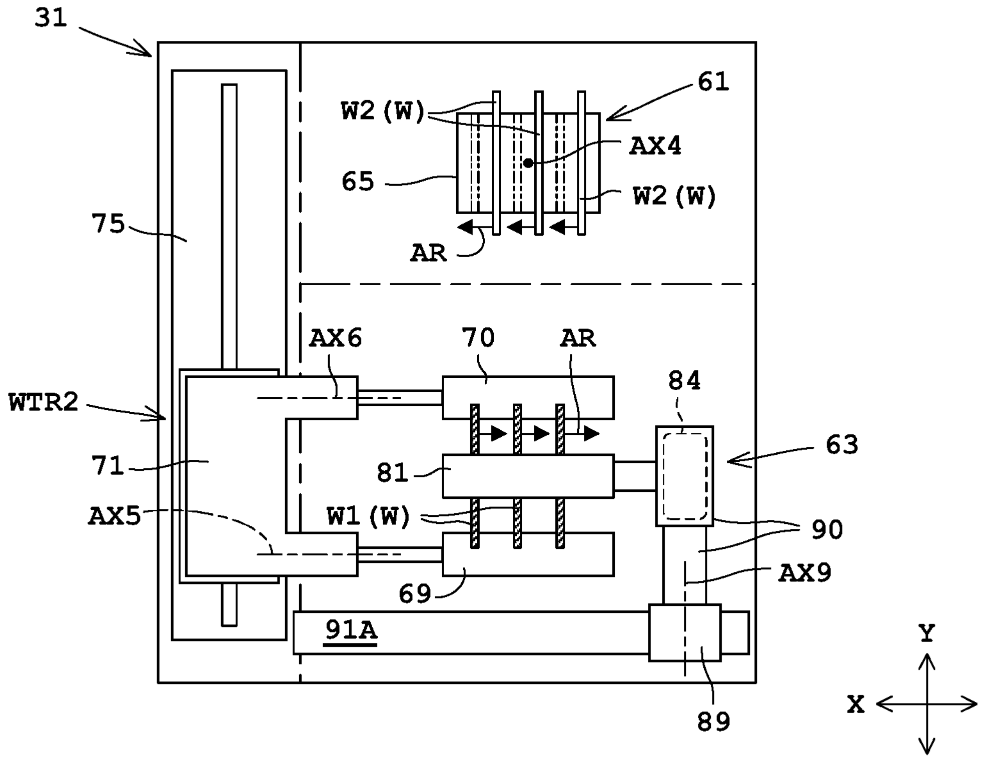
FIG. 4A is a plan view of a second posture turning mechanism.
Figure 4B:
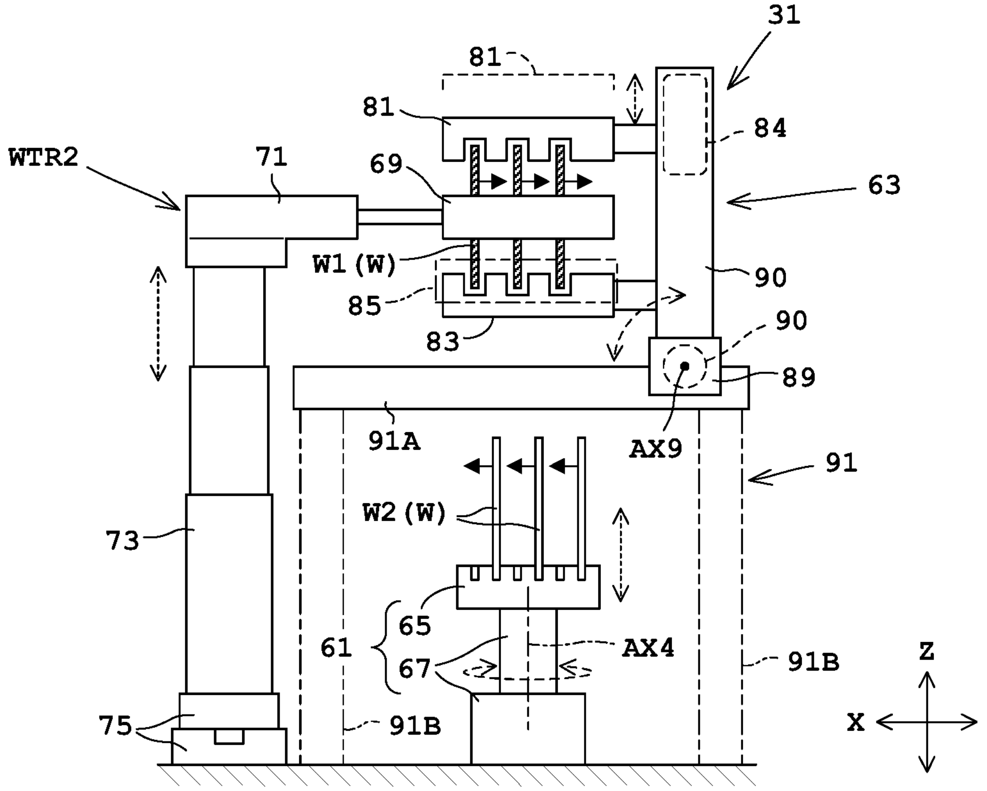
FIG. 4B is a front view of the second posture turning mechanism.
Figure 5:
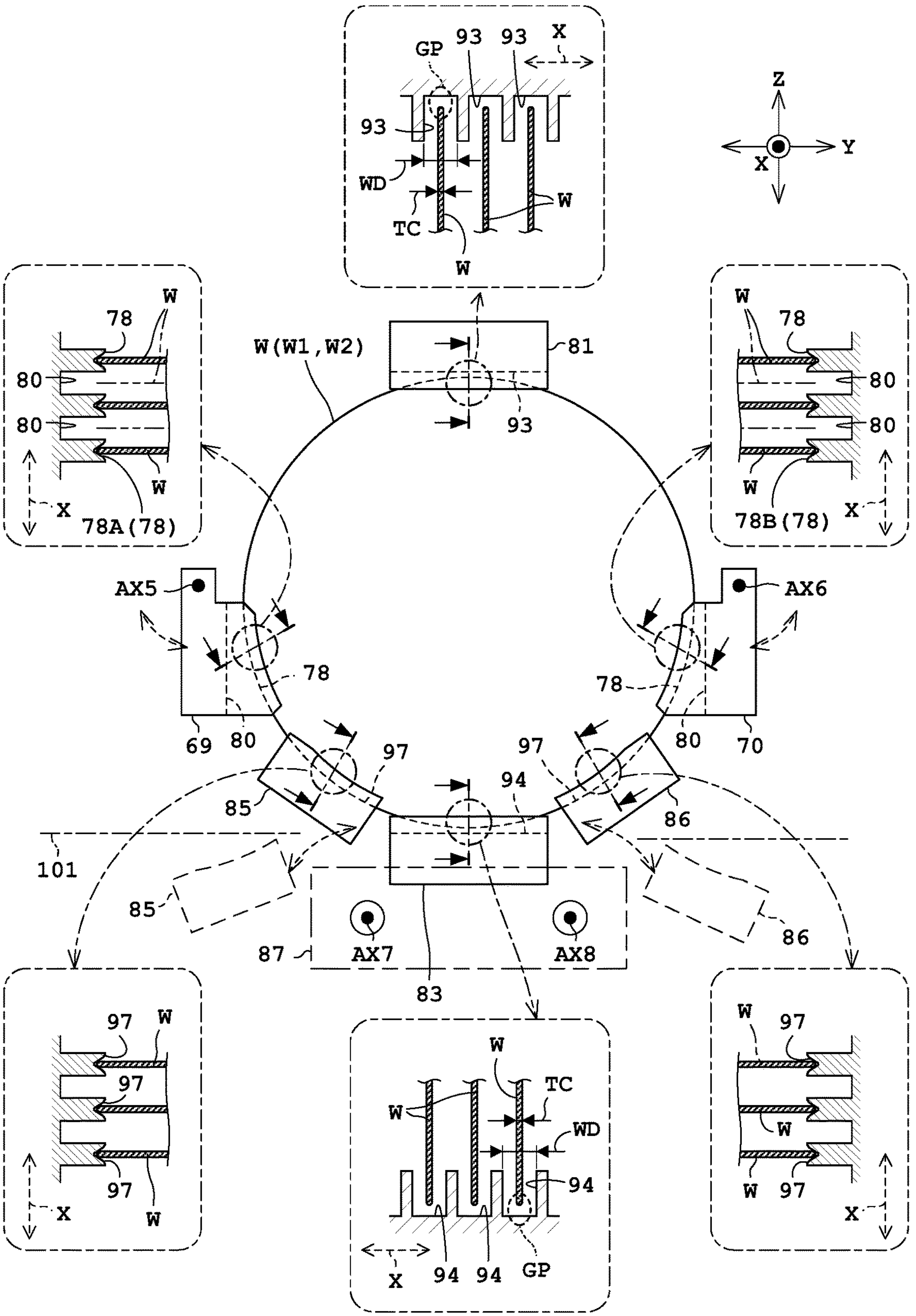
FIG. 5 is a side view of a second transport mechanism and the posture turning unit.

FIG. 4A is a plan view of the second posture turning mechanism 31. FIG. 4B is a front view of the second posture turning mechanism 31. FIG. 5 is a side view illustrating a second transport mechanism WTR2 and a posture turning unit 63. The second posture turning mechanism 31 includes a pusher mechanism 61, the second transport mechanism WTR2, and the posture turning unit 63. Here, the second posture turning mechanism 31 corresponds to the posture turning mechanism in the present invention. The second transport mechanism WTR2 corresponds to the second batch substrate transport mechanism in the present invention.

6-1. Pusher Mechanism

The pusher mechanism 61 receives a plurality of substrates W in the vertical posture, on which batch treatment is performed, from the first transport mechanism WTR1. The pusher mechanism 61 can hold the substrates W in the vertical posture, and can rotate the substrates W around a vertical axis AX4. The pusher mechanism 61 includes a pusher 65 and a lifting and rotating portion 67.

The pusher 65 holds the substrates W in the vertical posture that are transported by the first transport mechanism WTR1 and are arranged at a predetermined pitch (e.g., half pitch). The pusher 65 is provided at a position accessible by the first transport mechanism WTR1. That is, the pusher 65 and the six batch process tanks BT1 to BT6 are arranged linearly in plan view (see FIG. 1). The lifting and rotating portion 67 moves the pusher 65 upward and downward, and rotates the pusher 65 around the vertical axis AX4. The lifting and rotating portion 67 includes one electric motor, or two or more electric motors, for example. Here, the pusher 65 corresponds to the substrate holder in the present invention. The lifting and rotating portion 67 corresponds to the rotating portion in the present invention.

6-2. Second Batch Substrate Transport Mechanism (Second Transport Mechanism)

The second transport mechanism (robot) WTR2 transports the substrates W from the pusher 65. The second transport mechanism WTR2 includes two chucks (horizontal chucks) 69, 70, an opening and closing portion 71, a lifting member 73, and a horizontally moving portion 75. As shown in FIG. 5, the chucks 69, 70 hold the substrates W while radially supporting two lateral side portions on an outer edge of each of the substrates W in the vertical posture. The chucks 69, 70 each correspond to the horizontal chuck in the present invention.

The two chucks 69, 70 each have a plurality of (e.g., twenty-five) V-shaped holding grooves 78 and a plurality of (e.g., twenty-five) passing grooves 80. The V-shaped holding grooves 78 and the passing grooves 80 are arranged alternately one by one. The V-shaped holding grooves 78 each have a recess whose cross section is formed in a V-shape. Moreover, a V-shaped holding groove 78A of the chuck 69 faces a V-shaped holding groove 78B of the chuck 70. Accordingly, one-paired V-shaped holding grooves 78A, 78B hold one substrate W. The twenty-five-paired V-shaped holding grooves 78 of the two chucks 69, 70 hold twenty-five substrates W in a vertical posture individually. Consequently, adhesion of two adjacent substrates W can be prevented. This yields prevention of damages on the substrates W, for example.

The passing groove 80 does not hold a substrate W. The V-shaped holding grooves 78 are arranged at a predetermined pitch (e.g., full pitch). The passing grooves 80 are also arranged at a predetermined pitch (e.g., full pitch). Accordingly, the second transport mechanism WTR2 can pull out every other substrate W from the substrates W arranged at a half pitch.

The opening and closing portion 71 shown in FIG. 4A swings (rotates) the chuck 69 around a horizontal axis AX5, and swings the chuck 70 around a horizontal axis AX6. Accordingly, the opening and closing portion 71 can hold while supporting (gripping) the substrates W, and release supporting of the substrates W. When the substrate W is supported by the chucks 69, 70, a distance between the two recesses of the V-shaped holding grooves 78A, 78B is smaller than a diameter of the substrate W. As a result, the substrate W is to be held. Here, the two horizontal axes AX5, AX6 each extend in the front-back direction X where the substrates W are aligned. Moreover, the horizontal axis AX5 extends parallel to the horizontal axis AX6.

Moreover, the lifting member 73 moves the chucks 69, 70 and the opening and closing portion 71 upward and downward. The horizontally moving portion 75 moves the chucks 69, 70 and the lifting member 73 in the transverse direction Y (see FIG. 4A). The horizontally moving portion 75 moves the chucks 69, 70 between a position above the pusher 65 and a delivery position to the posture turning unit 63. The opening and closing portion 71, the lifting member 73, and the horizontally moving portion 75 each include an electric motor, for example.

Here, it is preferred that the chucks 69, 70 each have an upper end that is lower than an upper edge of each of the held substrates W. Moreover, it is preferred that the chucks 69, 70 each have a lower end that is higher than a lower edge of each of the held substrates W. This results in easy passing of the chucks 69, 70, holding the substrates W, between an upper chuck 81 and a lower chuck 83, mentioned later. Consequently, the chucks 69, 70 can deliver the substrates W smoothly to the upper chuck 81 and the lower chuck 83.

6-3. Posture Turning Unit

Figure 6A:
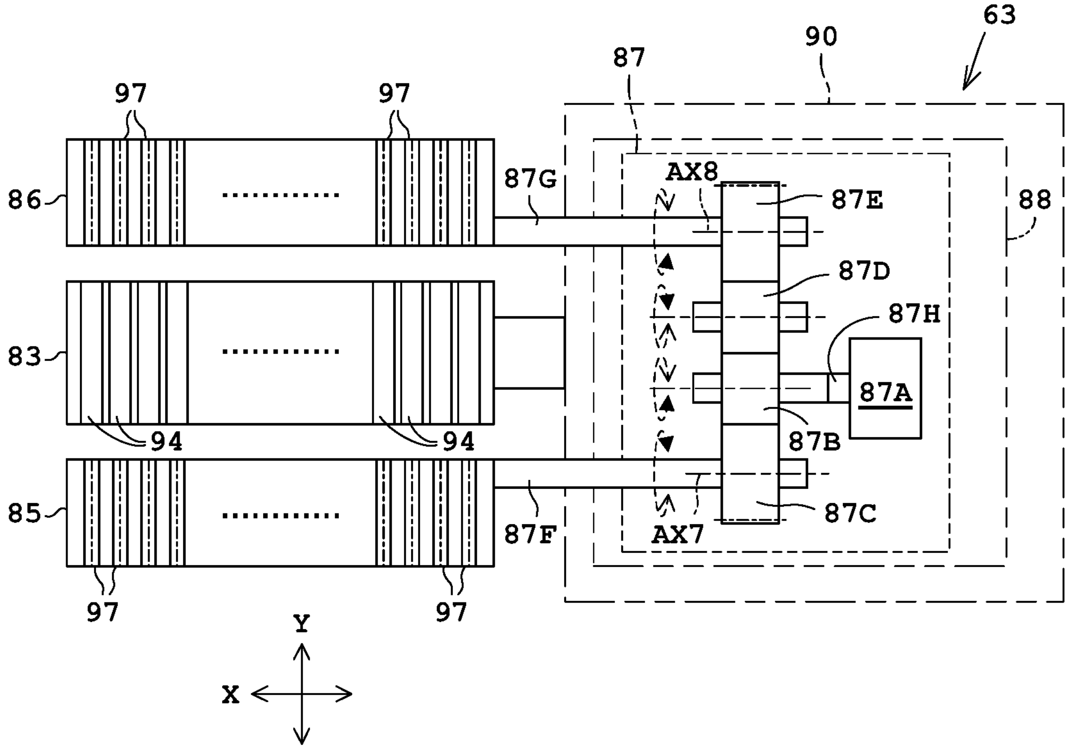
FIG. 6A is a plan view of an auxiliary chuck opening and closing portion of the posture turning unit.
Figure 6B:
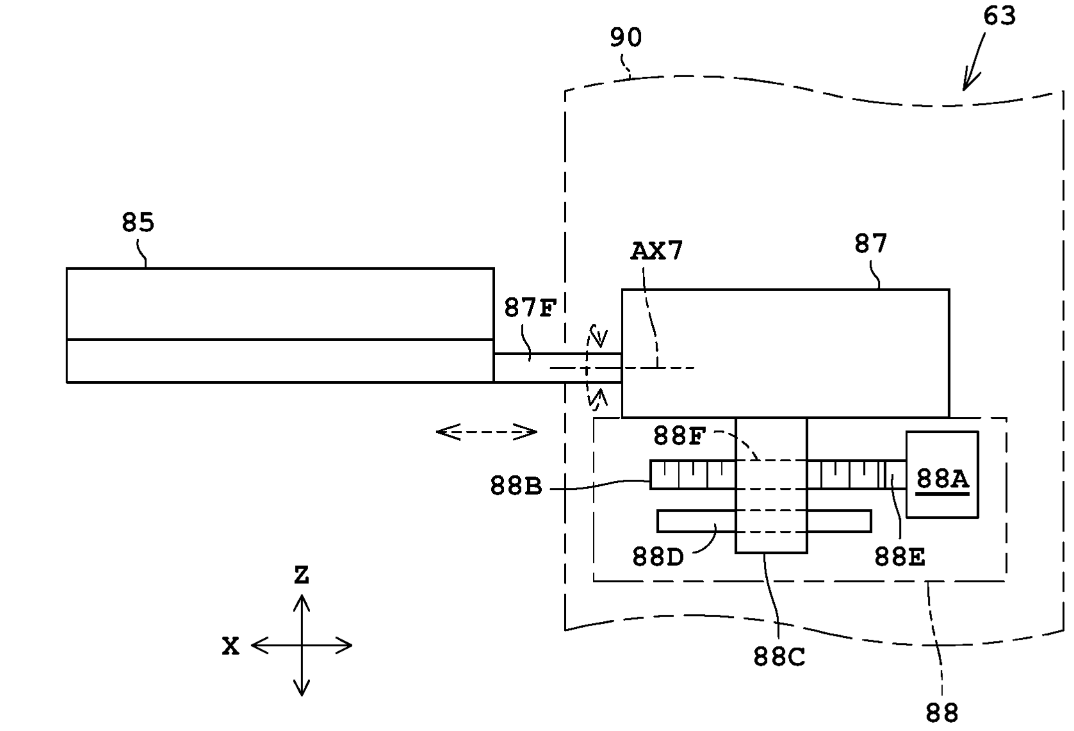
FIG. 6B is a side view of an advancing and withdrawing portion of the posture turning unit.
Figure 7A:
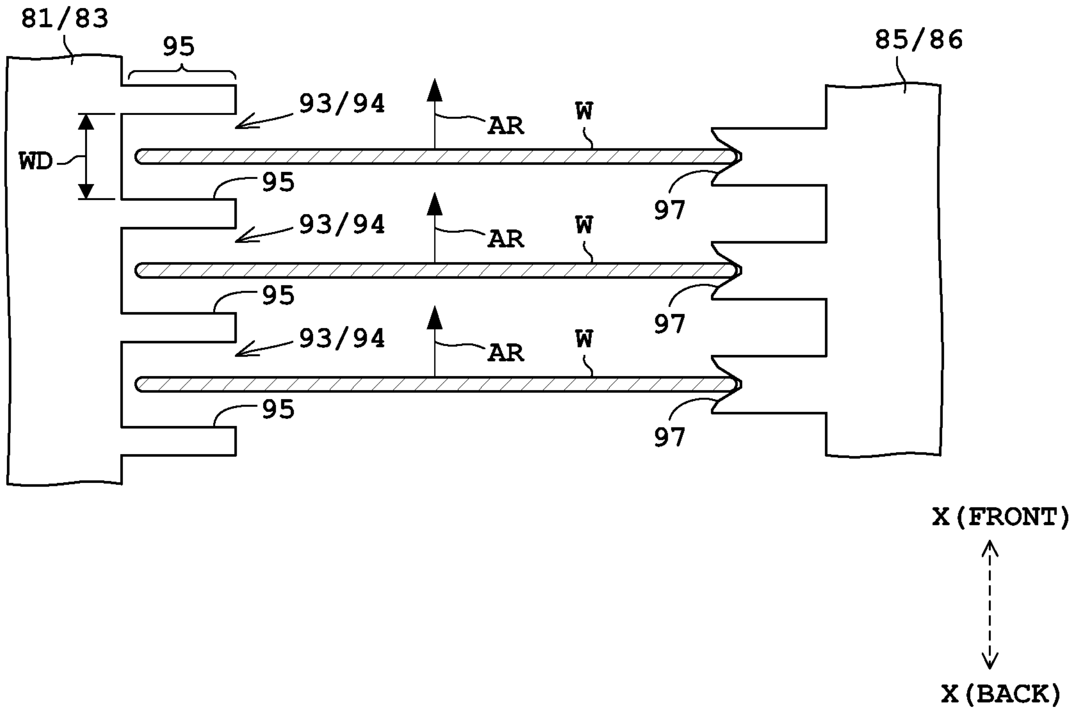
FIGS. 7A and 7B each illustrate operation of the advancing and withdrawing portion of the posture turning unit.
Figure 7B:
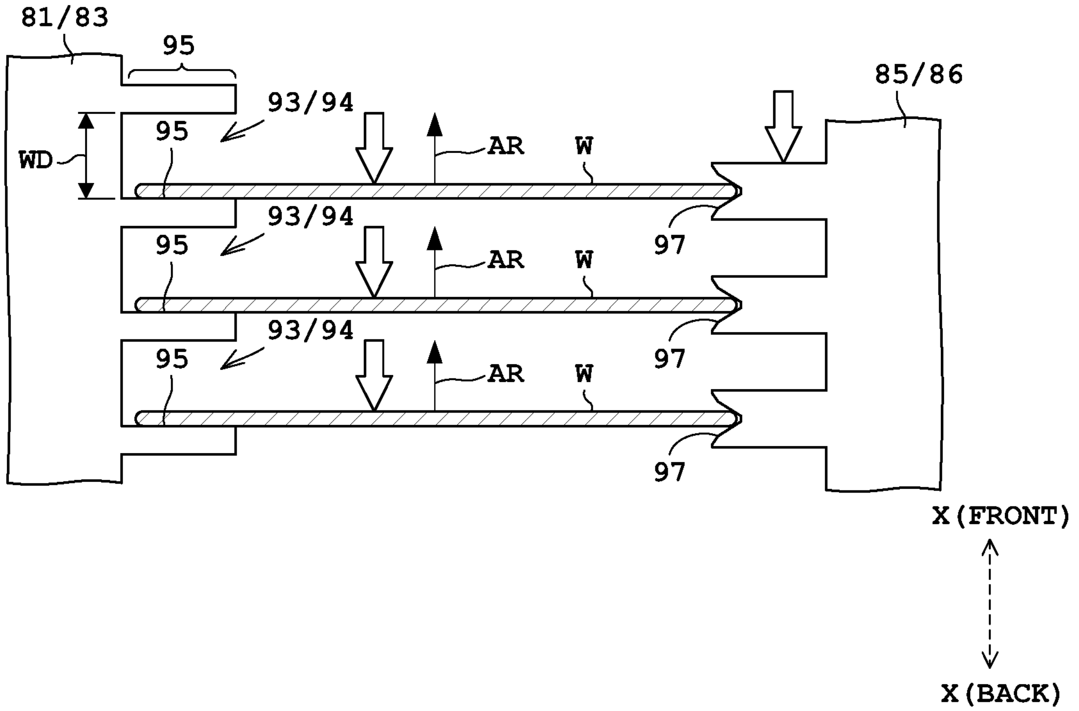

FIG. 6A is a plan view of an auxiliary chuck opening and closing portion 87 of the posture turning unit 63. FIG. 6B is a side view of an advancing and withdrawing portion 88 of the posture turning unit 63. FIGS. 7A and 7B each illustrate operation of the advancing and withdrawing portion 88 of the posture turning unit 63.

Reference is made to FIGS. 4A, 4B, and 6A. The posture turning unit 63 turns a posture of a substrates W, transported from the second transport mechanism WTR2, from vertical to horizontal. The posture turning unit 63 is provided at a position accessible by the center robot CR. The posture turning unit 63 includes the upper chuck 81, the lower chuck 83, an upper chuck moving portion 84, two auxiliary chucks 85, 86, the auxiliary chuck opening and closing portion 87, the advancing and withdrawing portion 88, an upper and lower chuck rotation unit 89, a support arm 90, and a base frame 91. The advancing and withdrawing portion 88 corresponds to the relative moving unit in the present invention.

The upper chuck 81 and the lower chuck 83 (hereunder, referred to as an "upper and lower chucks 81, 83", where appropriate) radially support an upper part and a lower part of each outer edge of the substrates W in the vertical posture held by the two chucks 69, 70. Accordingly, the upper chuck 81 and the lower chuck 83 can receive the substrates W directly from the two chucks 69, 70 of the second transport mechanism WTR2.

The upper chuck 81 is provided on the support arm 90 movably. The upper chuck moving portion 84 can move the upper chuck 81 close to or apart from the lower chuck 83.

The upper chuck moving portion 84 is provided in the support arm 90. The upper chuck moving portion 84 includes, for example, a linear actuator having an electric motor. The lower chuck 83 is provided on the support arm 90 not movably but fixedly.

As shown in FIG. 5, the upper chuck 81 includes a plurality of (e.g., twenty-five) first horizontal guide grooves 93. Likewise, the lower chuck 83 includes a plurality of (e.g., twenty-five) second horizontal guide grooves 94. For example, the twenty-five first horizontal guide grooves 93 are formed so as to house outer edges of the twenty-five substrates W individually. Moreover, the twenty-five second horizontal guide grooves 94 are formed so as to house outer edges of the twenty-five substrates W individually. Here, the horizontal guide grooves 93, 94 each have a mounting surface 95 on which one substrate W is placed (see FIG. 7A).

Moreover, the horizontal guide grooves 93, 94 each have a width WD larger than a thickness TC of the substrate W. That is, the horizontal guide grooves 93, 94 each have the width WD, from an inlet to the depth thereof, that is larger than the thickness TC of the substrate W. Accordingly, since a space is generated for lifting the substrates W after the posture of the substrates W is turned to horizontal and when the center robot CR takes the substrates W from the upper and lower chucks 81, 83, the substrates W can be taken with no load thereon.

That is, when the hands 35 of the center robot CR takes one substrate W in a horizontal posture from the horizontal guide grooves 93, 94, the one substrate W in the horizontal posture can be moved upward within the horizontal guide grooves 93, 94. This is because the horizontal guide grooves 93, 94 each have a space where the substrate W is freely movable.

Moreover, when the upper chuck 81 and the lower chuck 83 support the substrate W, a gap GP (space) is provided within the horizontal guide grooves 93, 94 for moving the substrate W in a radial direction of the substrate W.

The auxiliary chucks 85, 86 each hold a lower side of the substrate W. The two auxiliary chucks 85, 86 are provided on both sides of the lower chuck 83 along a circumferential direction of the substrate W. Detailed description is made hereunder with reference to FIG. 5. When the two chucks 69, 70, the upper chuck 81, and the lower chuck 83 support the substrate W, a first auxiliary chuck 85 is arranged between the chuck 69 and the lower chuck 83. Moreover, a second auxiliary chuck 86 is arranged between the chuck 70 and the lower chuck 83.

Similar to the chucks 69, 70, the two auxiliary chucks 85, 86 each have a plurality of (e.g., twenty-five) V-shaped holding grooves 97. The holding grooves 97 each have a recess whose cross section is formed in a V-shape.

When the upper chuck 81 and the lower chuck 83 hold the substrate W in a "vertical posture", the auxiliary chucks 85, 86 cause the outer edge of the substrate W to be housed in the V-shaped holding grooves 97, thereby holding the substrate W in the vertical posture. Moreover, when the upper chuck 81 and the lower chuck 83 hold the substrate W in a "horizontal posture", the two auxiliary chucks 85, 86 remove the substrate W from the V-shaped holding grooves 97, and then moves apart from the substrate W to a position where the substrate W is not prevented from being taken by the center robot CR.

When the upper chuck 81 and the lower chuck 83 hold substrates W in a vertical posture, the two auxiliary chucks 85, 86 in a closed state hold the substrates W in the vertical posture, achieving prevention of contact of two adjacent substrates W. Moreover, the two auxiliary chucks 85, 86 are in an opened state when the substrates W in the horizontal posture are taken from the upper chuck 81 and the lower chuck 83 without preventing taking the substrates W by the center robot CR.

The auxiliary chuck opening and closing portion 87 is provided on the support arm 90 via the advancing and withdrawing portion 88. The auxiliary chuck opening and closing portion 87 swings (rotates) the first auxiliary chuck 85 around a horizontal axis AX7, and swings the second auxiliary chuck 86 around a horizontal axis AX8. Description is made with reference to FIG. 6A. The auxiliary chuck opening and closing portion 87 includes, for example, an electric motor 87A, a first gear 87B, a second gear 87C, a third gear 87D, a fourth gear 87E, a first shaft 87F, and a second shaft 87G.

The first gear 87B is fixed on an output shaft 87H of the electric motor 87A. The second gear 87C is fixed on the first shaft 87F. The first shaft 87F is supported rotatably around a horizontal axis AX7. Moreover, a front end of the first shaft 87F is connected to the first auxiliary chuck 85. The third gear 87D is supported rotatably around the horizontal axis. The fourth gear 87E is fixed on the second shaft 87G. The second shaft 87G is supported rotatably around the horizontal axis AX8. Moreover, a front end of the second shaft 87G is connected to the second auxiliary chuck 86.

The two gears 87B, 87C engage with each other. The two gears 87B, 87D engage with each other. Moreover, the two gears 87D, 87E engage with each other. When the electric motor 87A causes the output shaft 87H to rotate forward, the auxiliary chucks 85, 86 hold the substrates W. In contrast to this, when the electric motor 87A causes the output shaft 87H to rotate rearward, the auxiliary chucks 85, 86 release the substrates W, and thus release holding of the substrates W.

Here, the two horizontal axes AX7, AX8 each extend in the front-back direction X where the substrates W are aligned. Moreover, the horizontal axis AX7 extends parallel to the horizontal axis AX8. When the auxiliary chucks 85, 86 do not hold the substrates W, the auxiliary chuck opening and closing portion 87 moves the one-paired auxiliary chucks 85, 86 outward of alternate long and short dashed lines 101 as shown in FIG. 5 by dotted lines.

The advancing and withdrawing portion 88 is provided on the support arm 90 as shown in FIG. 6B. The advancing and withdrawing portion 88 moves the auxiliary chucks 85, 86 (forward and rearward) relative to the upper and lower chucks 81, 83 in the front-back direction X where the substrates W are aligned. The advancing and withdrawing portion 88 includes an electric motor 88A, a threaded shaft 88B, a slider 88C, and a guide rail 88D, for example.

An output shaft 88E of the electric motor 88A is connected to a first end of the threaded shaft 88B. The threaded shaft 88B passes through the slider 88C while engaging with a nut 88F of the slider 88C. The guide rail 88D passes through the slider 88C. The slider 88C is movable freely relative to the guide rail 88D. The slider 88C is coupled to the auxiliary chuck opening and closing portion 87. The threaded shaft 88B and the guide rail 88D extend in the front-back direction X where the substrates W are aligned. When the electric motor 88A causes the output shaft 88E to rotate forward, the auxiliary chucks 85, 86 move forward relative to the upper and lower chucks 81, 83. In contrast to this, when the electric motor 88A causes the output shaft 88E to rotate rearward, the auxiliary chucks 85, 86 move rearward relative to the upper and lower chucks 81, 83.

When the posture turning unit 63 turns a posture of substrates W from vertical to horizontal, the advancing and withdrawing portion 88 moves the two auxiliary chucks 85, 86 such that the substrates W housed in the vertical posture in the V-shaped holding grooves 97 each contact the mounting surface 95. Description is made with reference to FIGS. 7A, 7B. In FIGS. 7A and 7B, the upper and lower chucks 81, 83 are arranged on a left end of the substrates W and the auxiliary chucks 85, 86 are arranged on a right end of the substrates W for convenience of illustration.

FIG. 7A illustrates a condition immediately after the posture turning unit 63 receives the substrates W from the second transport mechanism WTR2 with use of the upper and lower chucks 81, 83 and the auxiliary chucks 85, 86. That is, outer edges of the substrates W are each positioned at the depth of the V-shaped holding groove 97 at the center of the width WD of each of the horizontal guide grooves 93, 94.

The advancing and withdrawing portion 88 can move the auxiliary chucks 85, 86 between a contact position and a standby position. When the posture of the substrates W is turned, the advancing and withdrawing portion 88 moves the auxiliary chucks 85, 86 rearward from the standby position to the contact position (moves rearward X). Accordingly, as shown in FIG. 7B, back faces of the substrates W in the vertical posture held in the V-shaped holding grooves 97 each contact or approach the mounting surfaces 95 of the horizontal guide grooves 93, 94 in the upper and lower chucks 81, 83, respectively.

The substrates W are freely movable in the horizontal guide grooves 93, 94 in a condition where the auxiliary chucks 85, 86 do not hold the substrates W. However, when the posture is turned, the substrates W are moved and contact in the horizontal guide grooves 93, 94. This may generate particles. Then, the advancing and withdrawing portion 88 causes the substrates W to contact or approach the mounting surfaces 95, thereby achieving suppressed impact due to contact of the substrates W. This can suppress generation of particles.

The upper and lower chuck rotation unit 89 shown in FIG. 4B rotates the upper and lower chucks 81, 83 around a horizontal axis AX9 orthogonal to the alignment direction (front-back direction X) of twenty-five substrates W in the vertical posture held by the upper and lower chucks 81, 83. This turns a posture of the twenty-five substrates W received from the two chucks 69, 70 from vertical to horizontal. Here, the horizontal axis AX9 extends in the transverse direction Y.

The upper and lower chuck rotation unit 89 is provided on the base frame 91. The base frame 91 includes a beam member 91A extending horizontally in the front-back direction X, and two column members 91B supporting both ends of the beam member 91A, for example. The upper and lower chuck rotation unit 89 supports the upper and lower chucks 81, 83 rotatably around the horizontal axis AX9 via the L-shaped support arm 90. The upper and lower chuck rotation unit 89 include an electric motor, for example.

6. Operation Explanation

Figure 8:
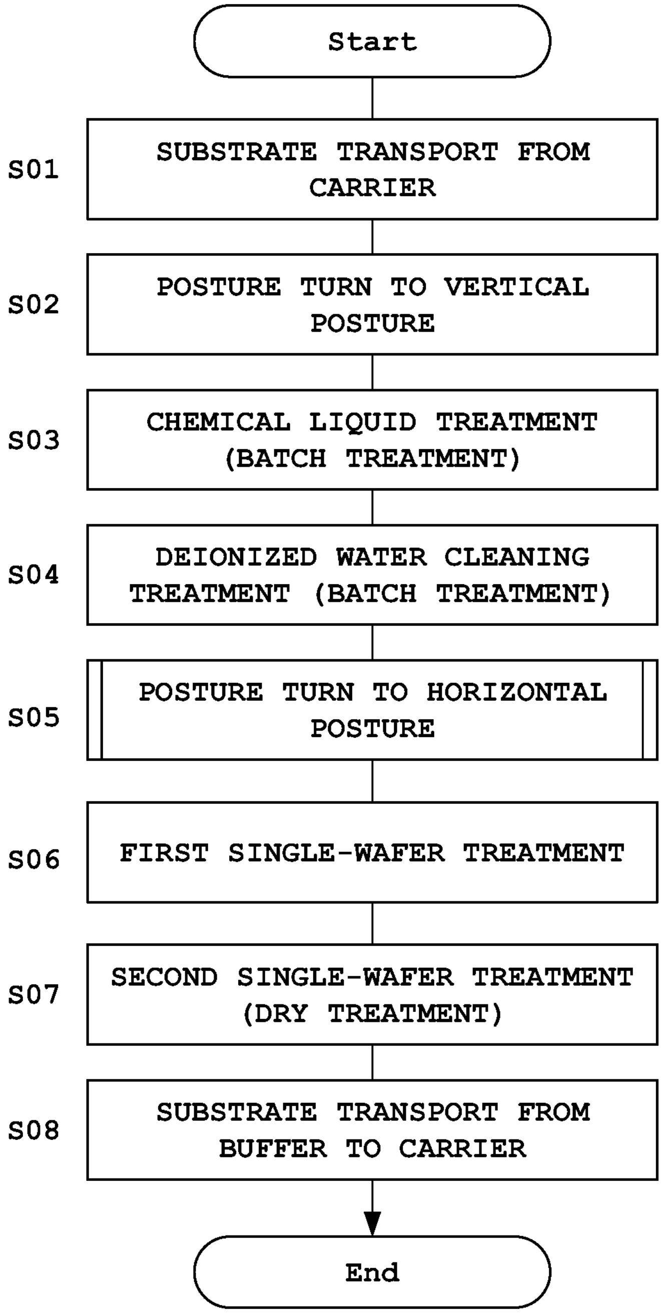
FIG. 8 is a flowchart illustrating operation of the substrate treating apparatus.
Figure 9:
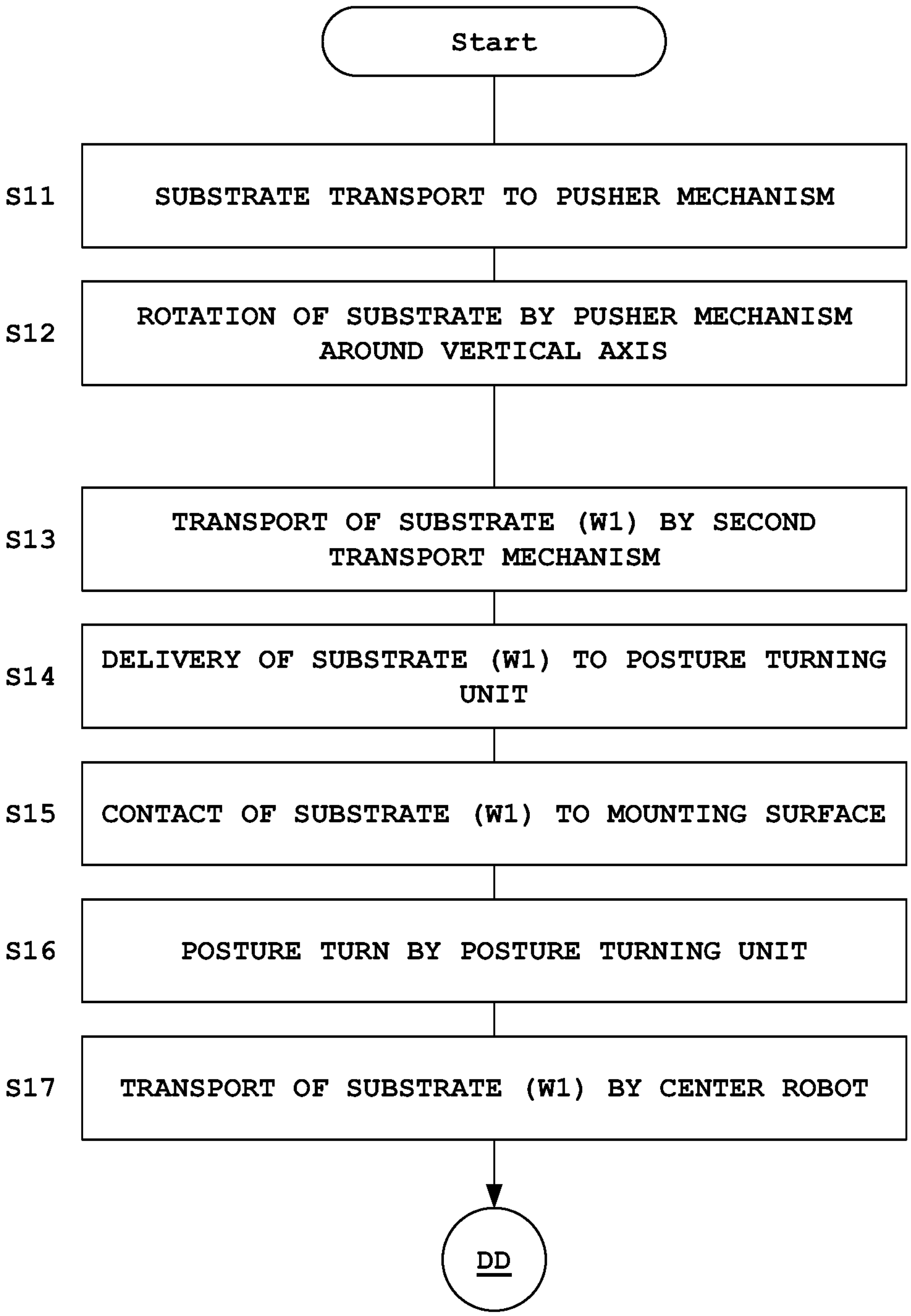
FIG. 9 is a flowchart illustrating first-half operation of a second posture turning mechanism.
Figure 10:
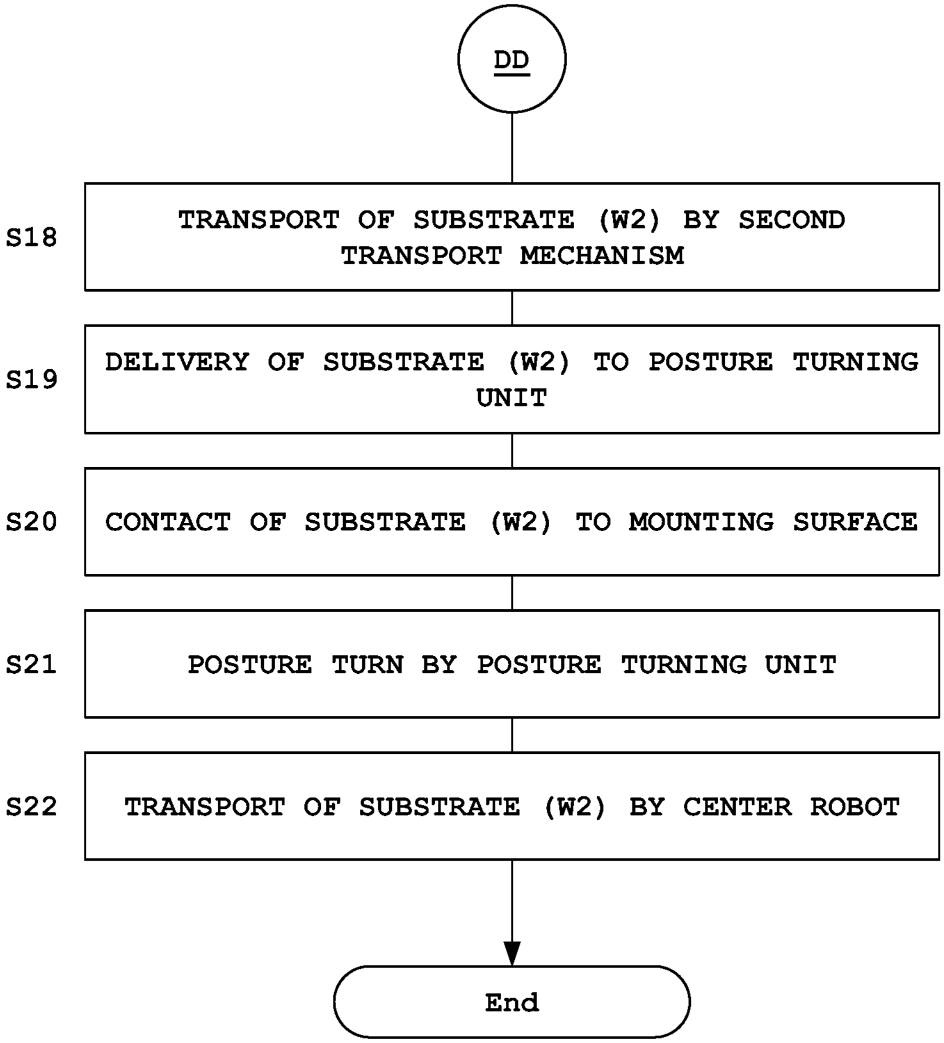
FIG. 10 is a flowchart illustrating second-half operation of the second posture turning mechanism.

The following describes operation of the substrate treating apparatus 1 with reference to flowcharts in FIGS. 8 to 10. Reference is made to FIG. 1. An external transport robot, not shown, transports two carriers C into a load port 9 in order.

[Step S01] Transportation of Substrate from Carrier

The transport mechanism 11 of the stocker block 3 transports a first carrier C from the load port 9 to a shelf 13A. The collective transport mechanism HTR of the transferring block 5 takes twenty-five substrates W1 in a horizontal posture from the first carrier C placed on the shelf 13A, and transports the substrates W1 to the posture turning unit 23. Thereafter, the carrier transport mechanism 11 transports the empty first carrier C to another shelf 13B. Then, the transport mechanism 11 transports a second carrier C from the load port 9 to the shelf 13A. The collective transport mechanism HTR takes twenty-five substrates W2 in a horizontal posture from the second carrier C placed on the shelf 13A, and transports the substrates W2 to the posture turning unit 23.

[Step S02] Posture Turn to Vertical Posture

In the posture turning unit 23, fifty substrates W (W1, W2) of two carriers C are transported. As shown in FIGS. 3A to 3F, the posture turning unit 23 and the pusher mechanism 25 cause the fifty substrates W to be aligned at a half pitch (5 mm) in a face-to-face system, and turn the posture of the fifty substrates W from horizontal to vertical by twenty-five. The pusher mechanism 25 transports the fifty substrates W in the vertical posture to the substrate delivery position PP determined in the transferring block 5.

[Step S03] Chemical Treatment (Batch Treatment)

The first transport mechanism WTR1 receives the fifty substrates W in the vertical posture from the pusher mechanism 25 at the substrate delivery position PP, and transports the fifty substrates W to any of the four lifters LF1 to LF4 in the four chemical liquid process tanks BT1 to BT4, respectively.

For example, the first transport mechanism WTR1 transports the fifty substrates W to the lifter LF1 of the chemical liquid process tank BT1. The lifter LF1 receives the fifty substrates W at a position above the chemical liquid process tank BT1. The lifter LF1 immerses the fifty substrates W in phosphoric acid for the treatment liquid within the chemical liquid process tank BT1. Accordingly, an etching treatment is performed on the fifty substrates W. After the etching treatment, the lifter LF1 pulls up the fifty substrates W from the phosphoric acid within the chemical liquid process tank BT1. It should be noted that similar treatment as in the chemical liquid process tank BT1 is performed when the fifty substrates W are transported to the other lifters LF2 to LF4 of the chemical liquid process tanks BT2 to BT4.

[Step S04] Deionized Water Cleaning Treatment (Batch Treatment)

The first transport mechanism WTR1 receives the fifty substrates W in the vertical posture from the lifter LF1 (or lifter LF2), for example, and transports the fifty substrates W to the lifter LF5 of the water cleaning process tank BT5. The lifter LF5 receives the fifty substrates W at a position above the water cleaning process tank BT5. The lifter LF5 immerses the fifty substrates W in the deionized water within the water cleaning process tank BT5. Accordingly, a cleaning treatment is performed on the fifty substrates W.

Here, when the first transport mechanism WTR1 receives the fifty substrates W in the vertical posture from either the lifter LF3 or LF4, the first transport mechanism WTR1 transports the fifty substrates W to a lifter LF6 of the water cleaning process tank BT6. The lifter LF6 receives the fifty substrates W at a position above the water cleaning process tank BT6. The lifter LF6 immerses the fifty substrates W in the deionized water within the water cleaning process tank BT6.

In this embodiment, the second posture turning mechanism 31 is provided opposite to the transferring block 5 across the six batch process tanks BT1 to BT6. The first transport mechanism WTR1 transports the fifty substrates W collectively to the second posture turning mechanism 31 from the batch process tank BT1 (BT3), for example, adjacent to the transferring block 5, through the batch process tank BT5 (BT6), apart from the transferring block 5.

[Step S05] Posture Turn to Horizontal Posture

The second posture turning mechanism 31 collectively turns a posture of the substrates W, on which the cleaning treatment is performed, from vertical to horizontal. Here, the following drawbacks arise. That is, if the posture of the fifty substrates W arranged at a half pitch (a pitch of 5 mm) is collectively turned, one of the hands 35 of the center robot CR may not possibly enter a gap between two adjacent substrates W of the fifty substrates W satisfactorily.

In addition, when the substrates W are aligned in a face-to-face system, the substrates W whose posture is turned to horizontal may be a substrate W whose device face is directed upward or a substrate W whose device face is directed downward. For example, it is not suitable that the hands 35 of the center robot CR contacts the device face of the substrate W. It is also not suitable that substrates W whose directions of the device faces are different are transported to the single-wafer processing chambers SW1 to SW4.

Then, in this embodiment, a gap between two adjacent substrates W is widened and the device faces of the fifty substrates W face in the same direction. Detailed description is made with reference to the flowcharts in FIGS. 9, 10, as well as FIGS. 11A to 11D, FIGS. 12A to 12D, and FIGS. 13A to 13D.

[Step S11] Transport of Substrate to Pusher Mechanism

Figure 11A:
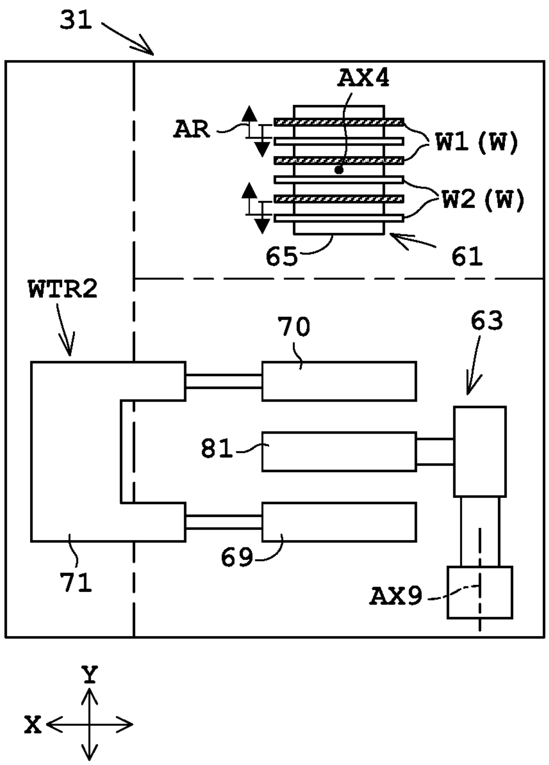
FIGS. 11A to 11D are each a plan view illustrating operation of the second posture turning mechanism.

Reference is made to FIG. 11A. Here, FIGS. 11A to 11D are each a plan view illustrating the operation of the second posture turning mechanism 31. The first transport mechanism WTR1 transports fifty substrates W from either the lifter LF5 or LF6 to the pusher mechanism 61 of the second posture turning mechanism 31 (see FIG. 1). The pusher 65 of the pusher mechanism 61 holds the fifty substrates W in a vertical posture arranged in a face-to-face system and at a half pitch. Moreover, the fifty substrates W are aligned in the transverse direction Y.

Moreover, the second transport mechanism WTR2 is at stand-by at a position close to the posture turning unit 63 so as not interfere with the first transport mechanism WTR1. Moreover, after transporting the substrates W to the pusher mechanism 61, the first transport mechanism WTR1 moves from above the pusher mechanism 61.

[Step S12] Rotation of Substrate by Pusher Mechanism Around Vertical Axis

Figure 11B:
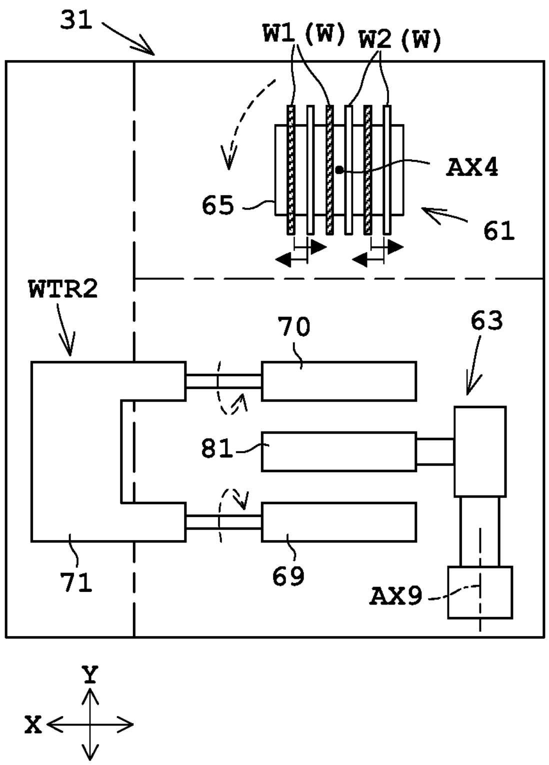

Reference is made to FIG. 11B. The lifting and rotating portion 67 of the pusher mechanism 61 rotates the fifty substrates W counterclockwise by 90 degrees around the vertical axis AX4 in plan view. Consequently, the pusher mechanism 61 can deliver the substrates W to the second transport mechanism WTR2, and can also make the device faces of the twenty-five substrates W1 in the first substrate group upward when the substrate posture is turned.

[Step S13] Transport of Substrate (W1) by Second Transport Mechanism

The second transport mechanism WTR2 moves close to a position where the substrates are in a standby state. That is, the second transport mechanism WTR2 moves such that the chucks 69, 70 are positioned above the fifty substrates W held by the pusher 65. The opening and closing portion 71 makes the chucks 69, 70 opened such that the fifty substrates W can pass between the chucks 69, 70.

Figure 11C:
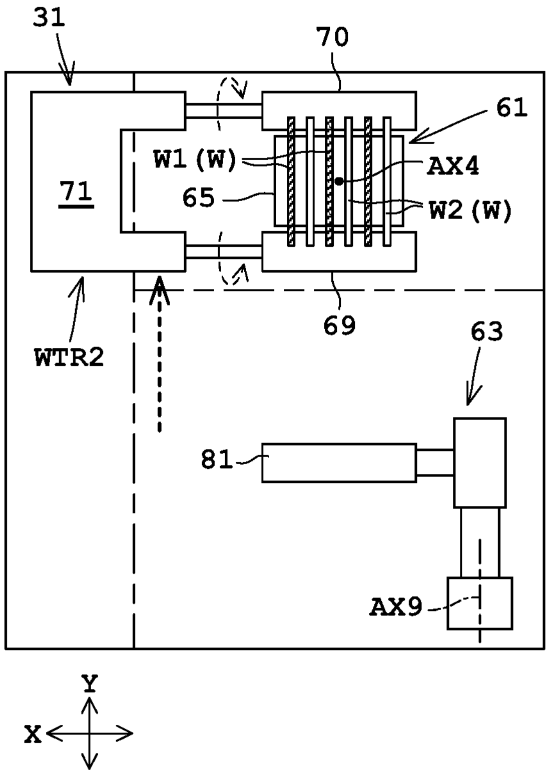

Reference is made to FIG. 11C. After the chucks 69, 70 are moved above the substrates W, the lifting member 73 of the second transport mechanism WTR2 moves the chucks 69, 70 downward below the center of the substrates W. Thereafter, the opening and closing portion 71 closes the chucks 69, 70 to support the fifty substrates W. At this time, the twenty-five substrates W1 are positioned in twenty-five V-shaped holding grooves 78, and the twenty-five substrates W2 are positioned in twenty-five passing grooves 80 individually.

After the fifty substrates W are supported by the chucks 69, 70, the lifting member 73 moves the chucks 69, 70 upward. Accordingly, the second transport mechanism WTR2 can pull out the twenty-five substrates W1, arranged at a full pitch (e.g., 10 mm), from the fifty substrates W (W1, W2) held by the pusher 65. In other words, the twenty-five substrates W2 in the second substrate group remain on the pusher 65.

Figure 11D:
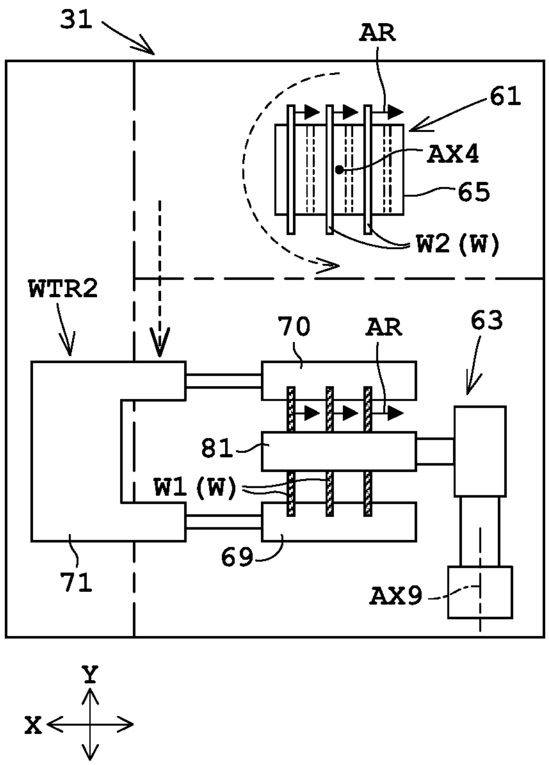

Reference is made to FIG. 11D. The second transport mechanism WTR2 collectively transports the twenty-five substrates W1 between the upper and lower chucks 81, 83 of the posture turning unit 63. At this time, the upper chuck moving portion 84 moves the upper chuck 81 to an open position apart from the lower chuck 83. Moreover, the auxiliary chucks 85, 86 are closed for holding substrates W in a vertical posture. Here, the auxiliary chucks 85, 86 may be opened.

Moreover, the lifting and rotating portion 67 of the pusher mechanism 61 rotates the twenty-five substrates W2, held by the pusher 65, around the vertical axis AX4 by 180 degrees. Consequently, the pusher mechanism 61 can make the device faces of the twenty-five substrates W2 in the second substrate group upward when the substrate posture is turned. Moreover, such 180-degree rotation moves positions of the substrates W2 rearward X at a half pitch from those before the rotation. Accordingly, the twenty-five substrates W2 can be housed in the V-shaped holding grooves 78 of the chucks 69, 70 when the substrates W are transported. Here, such 180-degree rotation of the substrates W2 is preferably performed in the steps S13 to S17.

[Step S14] Delivery of Substrate (W1) to Posture Turning Unit

Figure 12A:
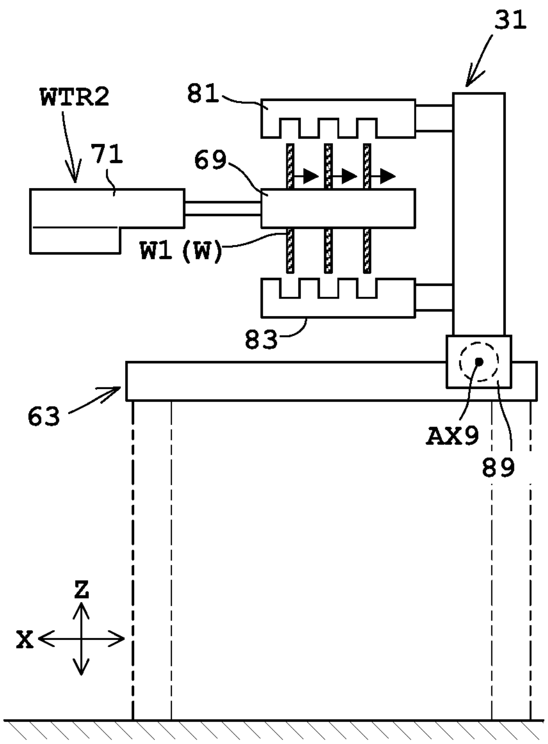
FIGS. 12A to 12D are each a front view illustrating the operation of the second posture turning mechanism.

Reference is made to FIG. 12A. FIGS. 12A to 12D are each a front view illustrating the operation of the second posture turning mechanism 31, i.e., a view from the single-wafer transportation region R2. FIG. 12A is also a front view of a condition where the second transport mechanism WTR2 in FIG. 11D moves the twenty-five substrates W1 between the upper and lower chucks 81, 83.

Figure 12B:
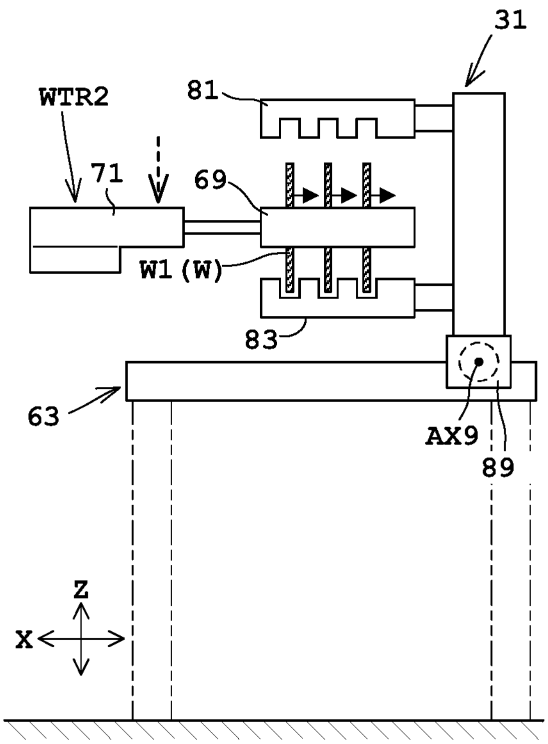

Reference is made to FIG. 12B. The auxiliary chucks 85, 86 are closed for holding substrates W in a vertical posture. The lifting member 73 of the second transport mechanism WTR2 moves twenty-five substrates W1, held by the chucks 69, 70, downward until the substrates W1 contact the V-shaped holding grooves 97 of the auxiliary chucks 85, 86. Specifically, the lifting member 73 moves twenty-five substrates W1 downward until the twenty-five substrates W1 are held in the twenty-five V-shaped holding grooves 97. When the twenty-five substrates W1 are held in the twenty-five V-shaped holding grooves 97 of the auxiliary chucks 85, 86 individually, outer edges of the twenty-five substrates W1 are housed in the second horizontal guide grooves 94 of the lower chuck 83.

Thereafter, the upper chuck moving portion 84 moves the upper chuck 81 downward for causing the upper chuck 81 to approach the lower chuck 83. This causes the outer edges of the twenty-five substrates W1 to be housed in the first horizontal guide grooves 93 of the upper chuck 81. Moreover, the upper and lower chucks 81, 83 and the auxiliary chucks 85, 86 hold (grip) the twenty-five substrates W1.

Figure 12C:
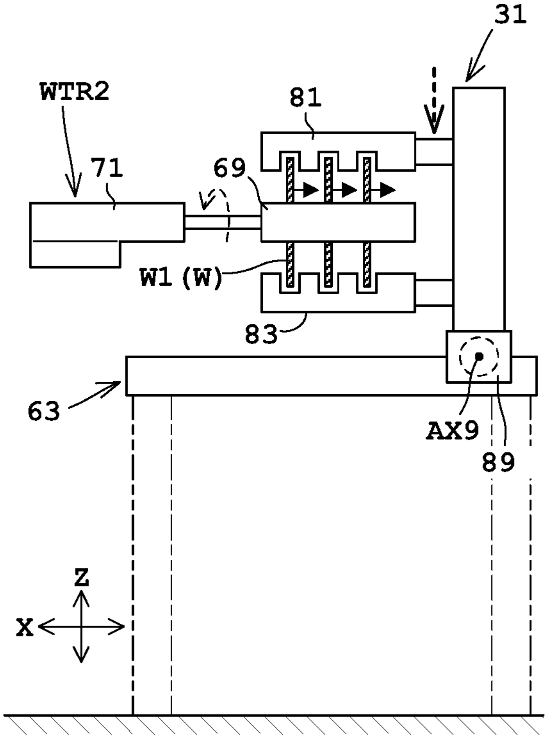

Reference is made to FIG. 12C. Thereafter, the opening and closing portion 71 of the second transport mechanism WTR2 opens the chucks 69, 70. This releases holding of the twenty-five substrates W1. Moreover, the twenty-five substrates W1 are delivered to the posture turning unit 63. Thereafter, the lifting member 73 of the second transport mechanism WTR2 moves the chucks 69, 70 upward to the above of the substrates W. This causes the second transport mechanism WTR2 to be moved to a position where it does not interfere with the posture turning unit 63.

[Step S15] Contact of Substrate (W1) to Mounting Surface

As shown in FIG. 6B, the advancing and withdrawing portion 88 moves the auxiliary chucks 85, 86 rearward (moves rearward X). Specifically, the advancing and withdrawing portion 88 causes the twenty-five substrates W1, held in the twenty-five V-shaped holding grooves 97 individually, to contact the mounting surfaces 95 of the horizontal guide grooves 93, 94 (see FIGS. 7A, 7B). Accordingly, impact due to movement of the substrates W1 can be suppressed when the posture is turned and the auxiliary chucks 85, 86 are opened.

[Step S16] Posture Turn by Posture Turning Unit

Figure 12D:
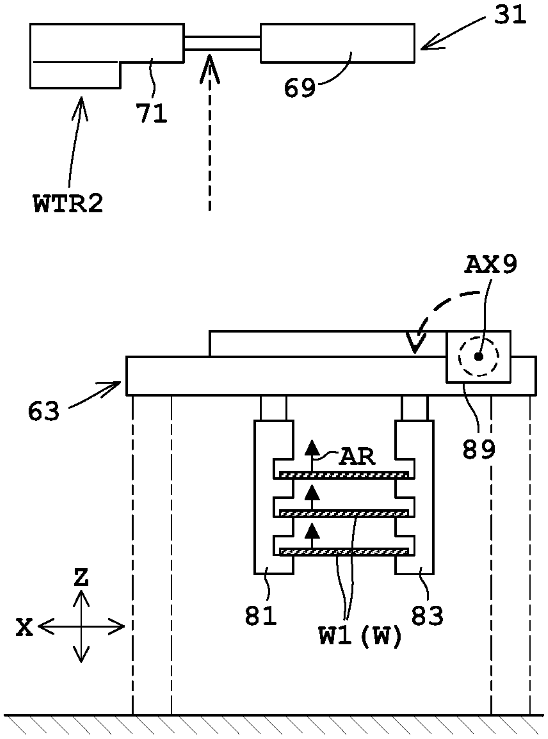

Reference is made to FIG. 12D. Then, the upper and lower chuck rotation unit 89 of the posture turning unit 63 rotates the upper and lower chucks 81, 83 and the like, holding the twenty-five substrates W1, counterclockwise by 90 degrees around the horizontal axis AX9. Accordingly, the posture of the twenty-five substrates W1 in the first substrate group can be turned from vertical to horizontal. After such 90-degree rotation, the auxiliary chuck opening and closing portion 87 opens the auxiliary chucks 85, 86 to a position where the auxiliary chucks 85, 86 do not prevent transportation of the substrates W1 by the center robot CR. That is, the auxiliary chucks 85, 86 are moved to a position illustrated by dotted lines in FIG. 5.

[Step S17] Transport of Substrate (W1) by Center Robot

After the auxiliary chucks 85, 86 are open, the center robot CR takes the twenty-five substrates W1 in the horizontal posture held by the upper and lower chucks 81, 83 in turn with the two hands 35, and transports the substrates W1 to either the single-wafer processing chamber SW1 or SW2. A pitch of the substrates W is widened from half to full. Accordingly, the hands 35 of the center robot CR can enter between the two adjacent substrates W satisfactorily. This allows suitably taking of the substrates W.

After the center robot CR transports the twenty-five substrates W1 in the first substrate group from the posture turning unit 63, a posture of the twenty-five substrates W2 in the second substrate group is turned. Here, steps S18 to S22 are similar to the steps S13 to S17, and thus the same part is to be described briefly.

[Step S18] Transport of Substrate (W2) by Second Transport Mechanism

Figure 13A:
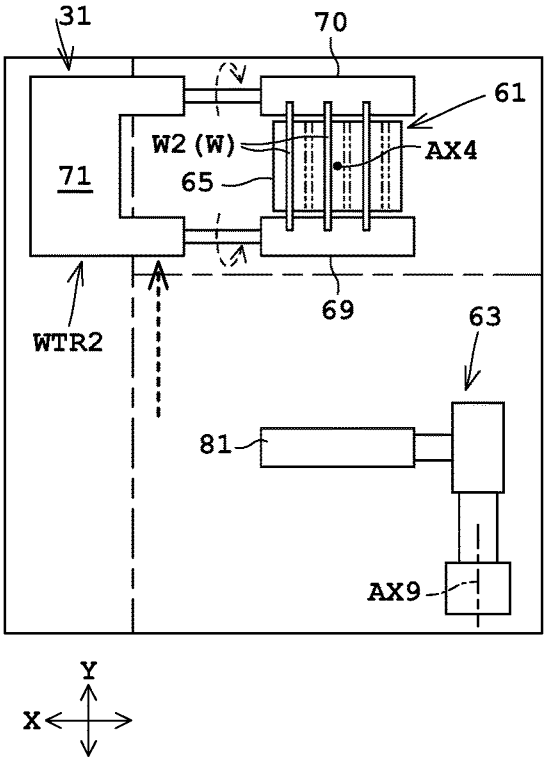
FIGS. 13A, 13B are each a plan view illustrating operation of the second posture turning mechanism.
Figure 13B:
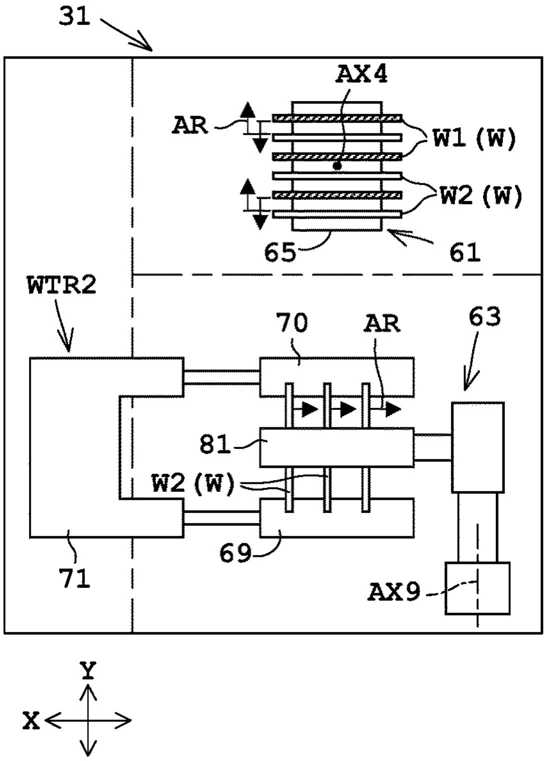

Reference is made to FIG. 13A. Here, FIGS. 13A, 13B are each a plan view illustrating the operation of the second posture turning mechanism 31. The second transport mechanism WTR2 moves such that the chucks 69, 70 are positioned above the twenty-five substrates W2 held by the pusher 65. Here, the chucks 69, 70 are opened.

Thereafter, the lifting member 73 of the second transport mechanism WTR2 moves the chucks 69, 70 below the center of the substrates W2. Then, the opening and closing portion 71 closes the chucks 69, 70 to support the twenty-five substrates W2. In the step S13, 180-degree rotation of the substrates W2 moves a position of the substrates W2 at a half pitch. Accordingly, when the chucks 69, 70 are closed, the twenty-five substrates W2 are positioned in the twenty-five V-shaped holding grooves 78 individually.

Thereafter, the lifting member 73 moves the chucks 69, 70 upward. Accordingly, the second transport mechanism WTR2 lifts up the twenty-five substrates W2 held by the pusher 65.

Reference is made to FIG. 13B. Then, the second transport mechanism WTR2 collectively transports the twenty-five substrates W2 between the upper and lower chucks 81, 83 of the posture turning unit 63. Here, after the second transport mechanism WTR2 transports the twenty-five substrates W2, the pusher 65 is brought into a condition where it does not hold the substrates W. Accordingly, the first transport mechanism WTR1 transports another fifty substrates W from either the lifter LF3 or LF6 to the pusher 65.

[Step S19] Delivery of Substrate (W2) to Posture Turning Unit

Figure 13C:
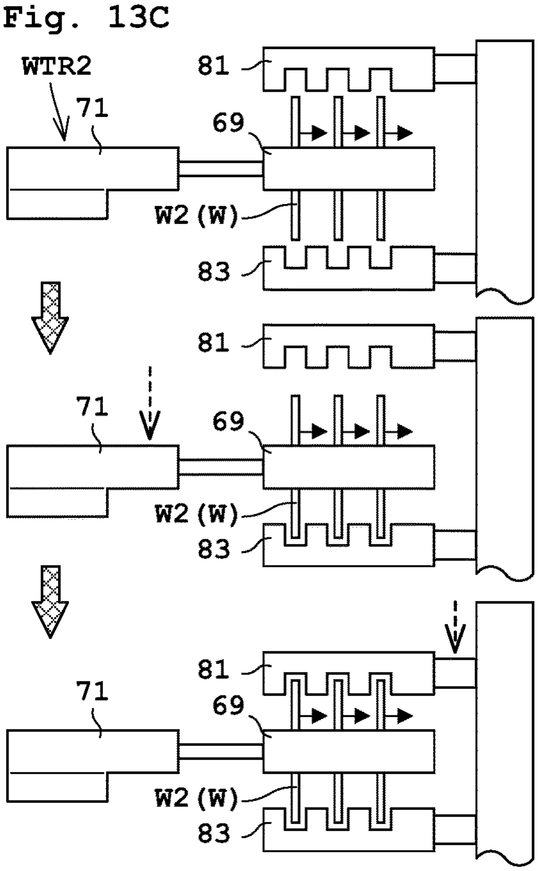
FIGS. 13C, 13D are each a front view illustrating operation of the second posture turning mechanism.
Figure 13D:
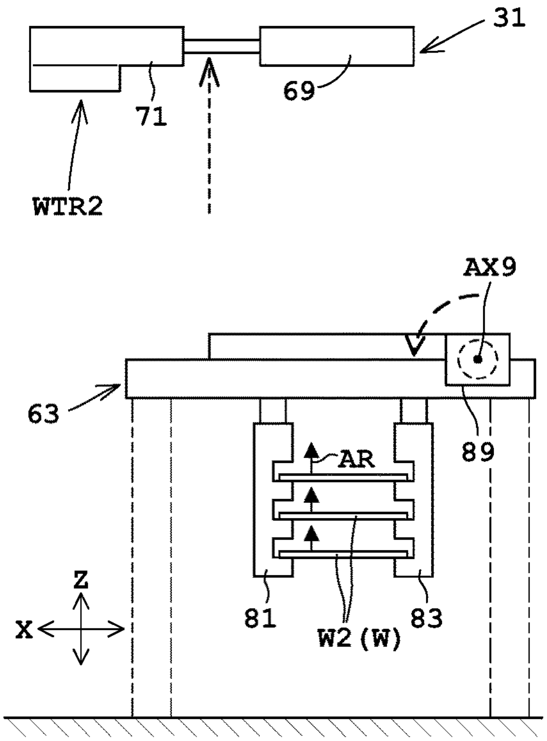

Reference is made to FIG. 13C. Now, FIGS. 13C, 13D are each a front view of the second posture turning mechanism 31. The twenty-five substrates W2 held by the chucks 69, 70 are positioned between the upper and lower chucks 81, 83. Moreover, the auxiliary chucks 85, 86 are closed for holding the substrates W2 in the vertical posture. Moreover, the auxiliary chucks 85, 86 are moved by the advancing and withdrawing portion 88 from the contact position (state of FIG. 7B) to the standby position (state of FIG. 7A).

Thereafter, the lifting member 73 of the second transport mechanism WTR2 moves twenty-five substrates W2, held by the chucks 69, 70, downward until the twenty-five V-shaped holding grooves 97 of the auxiliary chucks 85, 86 hold the twenty-five substrates W2 individually. Thereafter, the upper chuck moving portion 84 moves the upper chuck 81 downward. Accordingly, the upper and lower chucks 81, 83 and the auxiliary chucks 85, 86 hold (grip) the twenty-five substrates W2.

Thereafter, the opening and closing portion 71 of the second transport mechanism WTR2 opens the chucks 69, 70. Accordingly, hold of the twenty-five substrates W2 is released, and the twenty-five substrates W2 are delivered to the posture turning unit 63. Thereafter, the lifting member 73 of the second transport mechanism WTR2 moves the chucks 69, 70 upward to a position higher than the substrates W where the chucks 69, 70 do not interfere with the posture turning unit 63.

[Step S20] Contact of Substrate (W2) to Mounting Surface

Thereafter, the advancing and withdrawing portion 88 causes the twenty-five substrates W2, held in the twenty-five V-shaped holding grooves 97 individually, to contact the mounting surfaces 95 of the horizontal guide grooves 93, 94 (see FIGS. 7A, 7B).

[Step S21] Posture Turn by Posture Turning Unit

Reference is made to FIG. 13D. Then, the upper and lower chuck rotation unit 89 of the posture turning unit 63 rotates the upper and lower chucks 81, 83 and the like, holding the twenty-five substrates W2, counterclockwise by 90 degrees around the horizontal axis AX9. As a result, the posture of the twenty-five substrates W2 turns from vertical to horizontal. After such 90-degree rotation, the auxiliary chuck opening and closing portion 87 opens the auxiliary chucks 85, 86 to a position illustrated by dotted lines in FIG. 5.

[Step S22] Transport of Substrate (W2) by Center Robot

After the auxiliary chucks 85, 86 are open, the center robot CR takes the twenty-five substrates W2 in the horizontal posture in turn, and transports the substrates W2 to either the first single-wafer processing chamber SW1 or the second single-wafer processing chamber SW2.

[Step S06] First Single-Wafer Treatment

Description returns to the flowchart in FIG. 8. For example, the center robot CR transports substrates W (W1, W2) from the posture turning unit 63 to the first single-wafer processing chamber SW1. The first single-wafer processing chamber SW1 supplies deionized water to device faces of the substrates W from the nozzle 47 while the rotating unit 45 rotates the substrates W whose device faces are directed upward, for example. Then, the first single-wafer processing chamber SW1 supplies IPA from the nozzle 47 to the device faces (top faces) of the substrates W to replace the deionized water on the substrates W by the IPA.

[Step S07] Second Single-Wafer Treatment (Dry Treatment)

Thereafter, the center robot CR takes the substrates W, wet with the IPA, from the first single-wafer processing chamber SW1 (SW2), and transports the substrates W to either the single-wafer processing chamber SW3 or SW4. The single-wafer processing chambers SW3, SW4 each perform dry treatment on the substrates W with carbon dioxide under a supercritical state (supercritical fluid). Such dry treatment with the supercritical fluid can suppress pattern collapse of the device faces of the substrates W.

[Step S08] Substrate Transportation from Buffer Unit to Carrier

The center robot CR transports the substrates W, on which the dry treatment is performed, from either the single-wafer processing chamber SW3 or SW4 to any mount shelf of the buffer unit 33. When substrates W1 in one lot (twenty-five) are transported to the buffer unit 33, the collective transport mechanism HTR collectively transports the twenty-five substrates W1 from the buffer unit 33 into an empty first carrier C placed on a shelf 13A. Then, the transport mechanism 11 in the stocker block 3 transports the first carrier C to the load port 9.

Moreover, when substrates W2 in one lot are transported to the buffer unit 33, the collective transport mechanism HTR collectively transports the twenty-five substrates W2 from the buffer unit 33 into an empty second carrier C placed on a shelf 13A. Then, the transport mechanism 11 in the stocker block 3 transports the second carrier C to the load port 9. An external transport mechanism, not shown, transports the two carriers C into a next destination in order.

With this embodiment, the upper and lower chucks 81, 83 of the posture turning unit 63 support an upper portion and a lower portion on an outer edge of each of the substrates W1 (W2) in a vertical posture held by the two horizontal chucks 69, 70 of the second transport mechanism WTR2. Accordingly, the posture turning unit 63 can receive the substrates W1 (W2) directly from the two horizontal chucks 69, 70 of the second transport mechanism WTR2. Moreover, the pusher 65 is provided at a position accessible by the first transport mechanism WTR1, and the posture turning unit 63 is provided at a position accessible by the center robot CR. Accordingly, the second transport mechanism WTR2 can transport substrates W from the pusher 65 to the posture turning unit 63 even when the pusher 65 receives the substrates W from the first transport mechanism WTR1 at a position far away from the center robot CR. Accordingly, the center robot CR can easily access the posture turning unit 63.

Moreover, the upper and lower chuck rotation unit 89 rotates the upper and lower chucks 81, 83 around the horizontal axis AX9 orthogonal to an alignment direction of substrates W1 (W2) in a vertical posture held by the upper and lower chucks 81, 83. Accordingly, the substrates W1 (W2) can be taken out from a gap between the upper and lower chucks 81, 83, and the posture turning unit 63 is accessible along the horizontal axis AX9 orthogonal to the alignment direction of the substrates W1 (W2).

Moreover, the second posture turning mechanism 31 further includes the lifting and rotating portion 67 for rotating the pusher 65 around the vertical axis AX4. Consequently, substrates W in any directions can be delivered to the second transport mechanism WTR2. In addition, the substrates W in a horizontal posture after posture turning can be brought into any directions.

Moreover, the batch process tanks BT1 to BT6 and the second posture turning mechanism 31 are arranged in the horizontal front-back direction X (first direction), and the second transport mechanism WTR2 transports a plurality of substrates W from the pusher 65 in the horizontal transverse direction Y (second direction) orthogonal to the front-back direction X. When the batch process tanks BT1 to BT6 and their surrounding components are elongated in the transverse direction Y, the hands 35 of the center robot CR is sometimes hard to access. The second transport mechanism WTR2 can move in the transverse direction Y, whereby the posture turning unit 63 can approach the center robot CR. Accordingly, the center robot CR can transport the substrates W easily.

Moreover, the two horizontal chucks 69, 70 are each provided with the two or more V-shaped holding grooves 78 for holding two or more substrates W1 (W2) set in advance from a plurality of substrates W. The second transport mechanism WTR2 pulls out the two or more substrates W1 (W2) from the substrates W in a vertical posture held by the pusher 65 with use of the two horizontal chucks 69, 70. The second transport mechanism WTR2 can pull out and transport the two or more substrates W1 (W2) from the substrates W held by the pusher 65.

SECOND EMBODIMENT

Figure 14A:
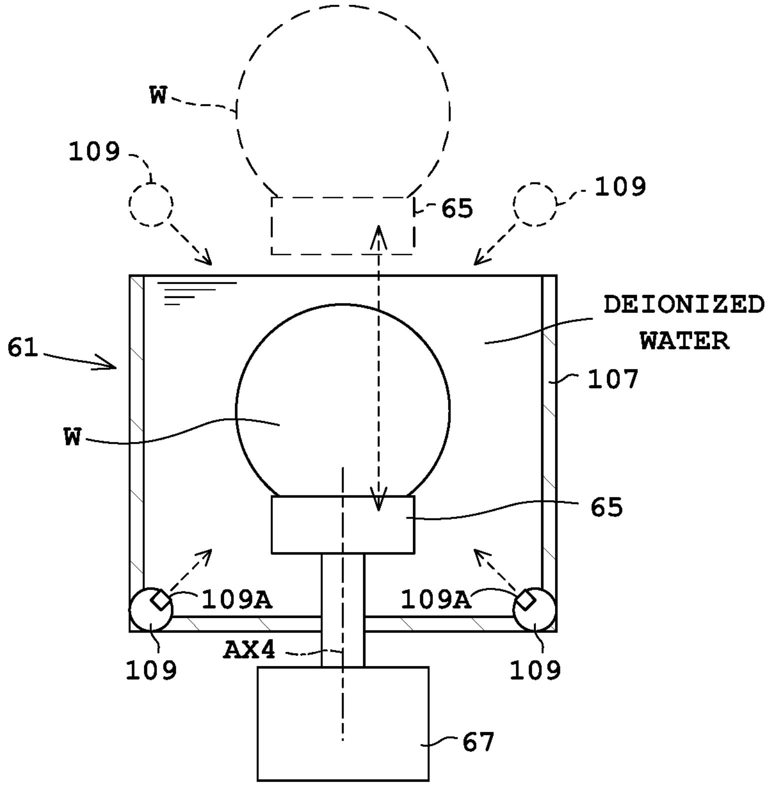
FIG. 14A is a longitudinal sectional view of a pusher mechanism of a second posture turning mechanism according to a second embodiment.
Figure 14B:
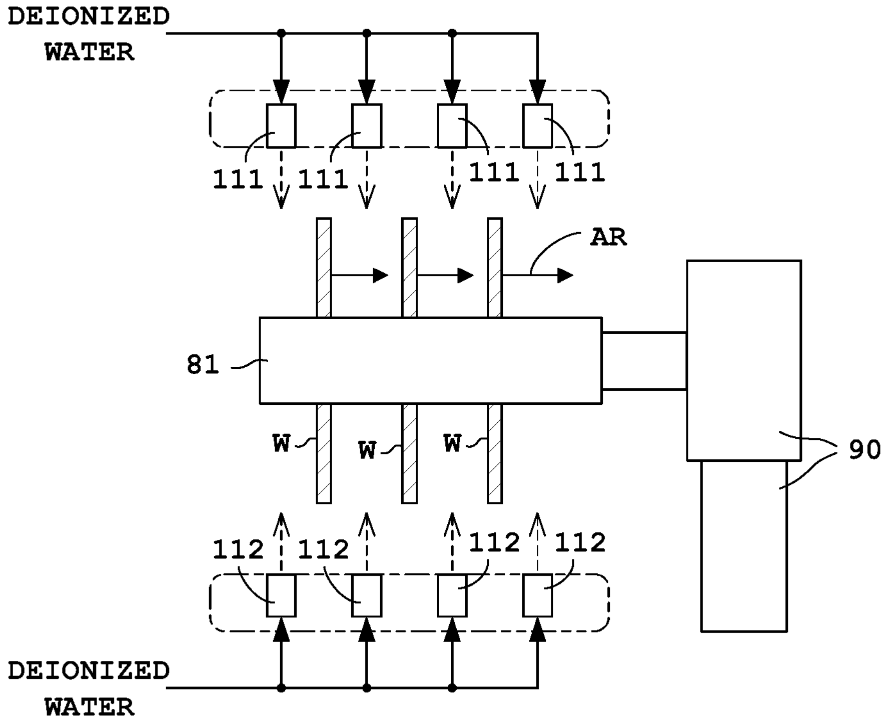
FIG. 14B is a plan view of the second posture turning mechanism according to the second embodiment.

The following describes a second embodiment of the present invention with reference to the drawings. Here, the description common to that of the first embodiment is to be omitted. FIG. 14A is a longitudinal sectional view of a pusher mechanism 61 of a second posture turning mechanism 31 according to the second embodiment. FIG. 14B is a plan view of the second posture turning mechanism 31 according to the second embodiment.

Reference is made to FIG. 14A. The pusher mechanism 61 of the second posture turning mechanism 31 in the second embodiment includes a stand-by tank 107 for storing a liquid and two jet pipes 109 for supplying deionized water (DIW) as the liquid, for example, to the stand-by tank 107 in order to immerse substrates W held by a pusher 65 in the liquid when the pusher 65 moves downward. The jet pipe 109 is formed to extend linearly in a front-back direction X or a transverse direction Y. The jet pipe 109 has a plurality of jet ports 109A (holder nozzles) extending along the jet pipe 109. The jet ports 109A each eject deionized water. The stand-by tank 107 stores deionized water ejected from the jet pipes 109.

As shown in FIG. 11D, for example, when the posture turning unit 63 turns a posture of substrates W1, substrates W2 at a stand-by state are immersed in the deionized water within the stand-by tank 107, leading to prevention of drying of the substrates W.

Note that the stand-by tank 107 does not necessarily store deionized water. In this case, the jet ports 109A of the jet pipe 109 may supply deionized water in a shower state or a mist state to substrates W held by the pusher 65. In addition, as shown by the jet pipe 109 by dotted lines in FIG. 14A, the jet ports 109A may positioned higher than the substrates W. When the deionized water in a shower state or a mist state is supplied to the substrates W, the stand-by tank 107 may or may not be provided.

Reference is next made to FIG. 14B. The second posture turning mechanism 31 includes a first group of nozzles 111 and a second group of nozzles 112. The nozzles 111, 112 are for the posture turning unit 63. The nozzles 111, 112 each supply deionized water (DIW) as a liquid, for example, in a shower state or a mist state to the substrates W held by upper and lower chucks 81, 83 of the posture turning unit 63. The first group of nozzles 111 and the second group of nozzles 112 are arranged so as to surround the substrates W in plan view. The nozzles 111, 112 are positioned higher than the substrates W. Moreover, the nozzles 111, 112 may be movable so as not to interfere with the second transport mechanism WTR2.

An upper and lower chuck rotation unit 89 turns a posture of the substrates W, held by the upper and lower chucks 81, 83 to either vertical or oblique. In this condition, the nozzles 111, 112 supply deionized water in a shower state or a mist state to the substrates W held by the upper and lower chucks 81, 83. Here, the oblique posture is a posture where device faces of substrates are directed upward.

For example, when the center robot CR suspends transportation of substrates W, drying of the substrates W held by the upper and lower chucks 81, 83 can be prevented. Moreover, if a posture of substrates W is horizontal in supplying deionized water, the deionized water in a shower state or a mist state is hard to spread over device faces entirely. However, the posture of the substrates W is turned to either vertical or oblique where the device faces are directed upward, leading to easy spread of the deionized water in a shower state or a mist state over the device faces.

Moreover, the substrate treating apparatus 1 may adopt both of the construction in FIG. 14A and the construction in FIG. 14B. Alternatively, the substrate treating apparatus 1 may adopt either of the construction in FIG. 14A or the construction in FIG. 14B.

If substrates W are dried before dry treatment in single-wafer processing chambers SW3, SW4, pattern collapse of the substrates W occurs. However, this embodiment can prevent drying of the substrates W held by the pusher 65. Moreover, this embodiment can prevent drying of the substrates W held by the upper and lower chucks 81, 83 of the posture turning unit 63.

THIRD EMBODIMENT

The following describes a third embodiment of the present invention with reference to the drawings. Here, the description common to that of the first and second embodiments is to be omitted.

The second transport mechanism WTR2 of the first embodiment shown in FIG. 4A can pull out twenty-five substrates W1 (W2) from fifty substrates W in a vertical posture held by the pusher 65. In other words, the second transport mechanism WTR2 of the first embodiment pulls out the substrates W with a single pattern. In this regard, a second transport mechanism WTR2 of the third embodiment can pull out substrates W with a plurality of (e.g., six) patterns in which at least either the number or a position of substrates is variable.

Figure 15A:
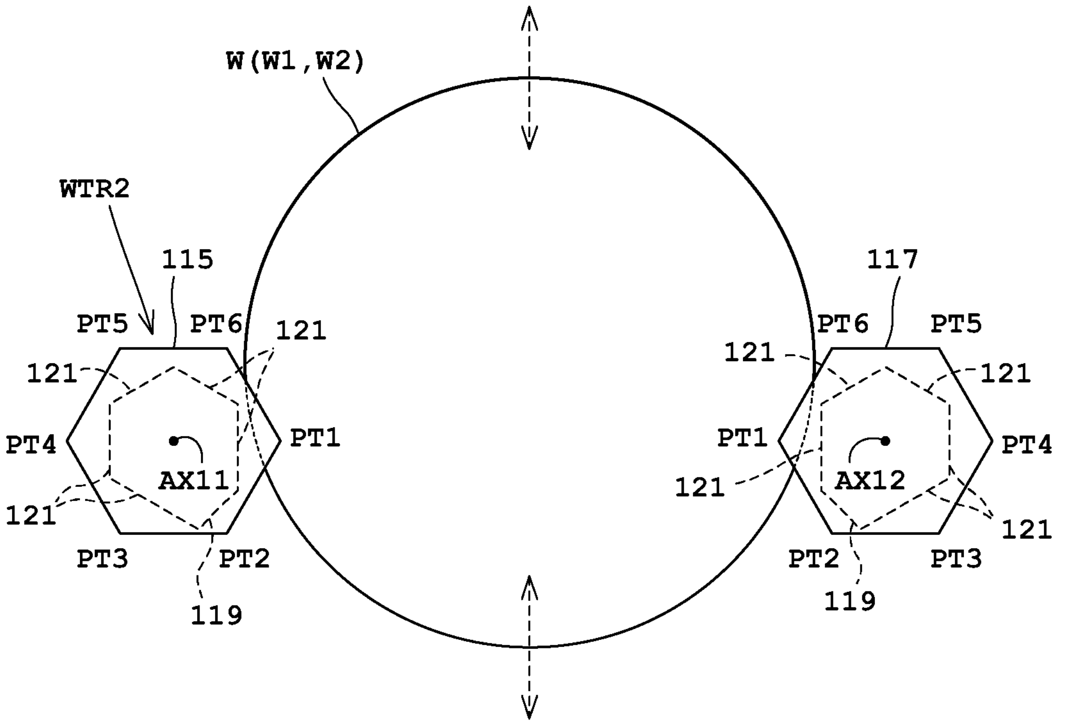
FIG. 15A is a side view according to a third embodiment in which a substrate is passed with two passing grooves of a predetermined pattern.
Figure 15B:
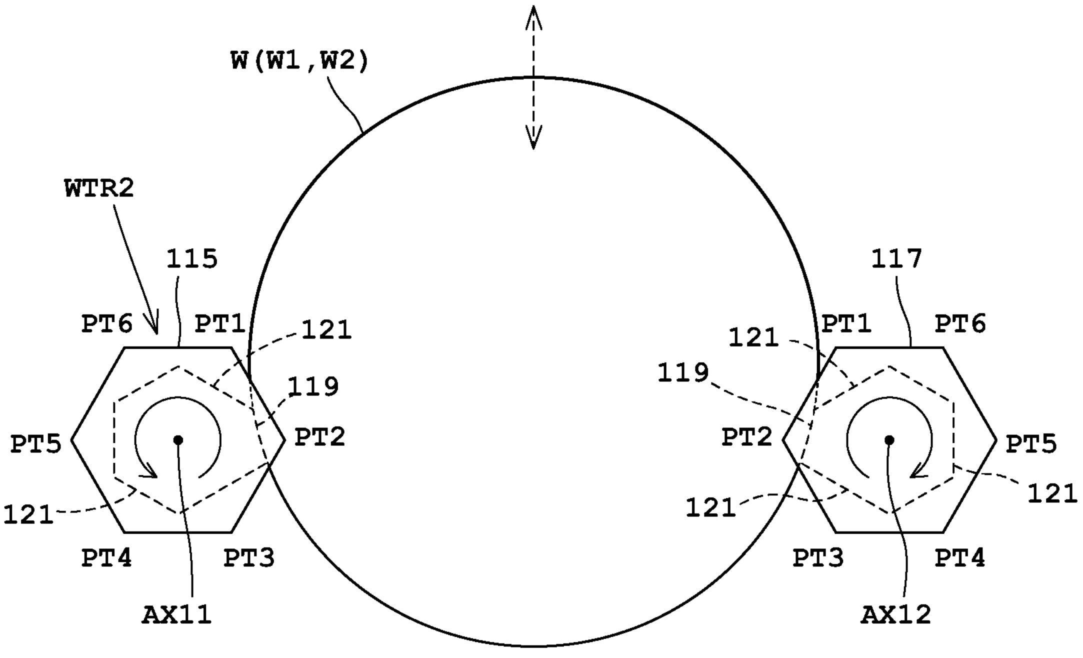
FIG. 15B is a side view according to the third embodiment in which a substrate is held by two holding grooves of another pattern.

Reference is made to FIGS. 15A and 15B. The second transport mechanism WTR2 includes two horizontal chucks 115, 117. A first horizontal chuck 115 is formed in a column shape so as to extend along a horizontal axis AX11, and is rotatable around the horizontal axis AX11. Moreover, a second horizontal chuck 117 is formed in a column shape so as to extend along a horizontal axis AX12, and is rotatable around the horizontal axis AX12. The two horizontal chucks 115, 117 are each rotated by an electric motor of an opening and closing portion 71 shown in FIG. 4A.

The second transport mechanism WTR2 of this embodiment pulls out one or more substrate W1 (W2) set in advance from twenty-five substrates W1 in a first substrate group (or twenty-five substrates W2 in a second substrate group) of fifty substrates W in a vertical posture held by a pusher 65. In order to achieve this, six patterns PT1 to PT6 are formed around a circumference face of the first horizontal chuck 115 around the horizontal axis AX11. Likewise, six patterns PT1 to PT6 are formed around a circumference face of the second horizontal chuck 117 around the horizontal axis AX12. In FIG. 15A, the two horizontal chucks 115, 117 are formed symmetrically. Moreover, the second transport mechanism WTR2 can switch the two horizontal chucks 115, 117 among the six patterns PT1 to PT6.

The six patterns PT1 to PT6 each have at least either holding grooves 119 or passing grooves 121. FIG. 15A illustrates holding grooves 119 and passing grooves 121 of the patterns PT1 to PT6 each corresponding to one substrate W. The five patterns PT1 and PT3 to PT6 each include a passing groove 121. In contrast to this, the pattern PT2 includes a holding groove 119.

As shown in FIG. 15A, the second transport mechanism WTR2 rotates the horizontal chucks 115, 117 such that the two patterns PT1, for example, face each other. Accordingly, the second transport mechanism WTR2 can pass a substrate W between the two horizontal chucks 115, 117. Moreover, as shown in FIG. 15B, the second transport mechanism WTR2 rotates the horizontal chucks 115, 117 such that the two patterns PT2, for example, face each other. Accordingly, the second transport mechanism WTR2 can hold a substrate W between the two horizontal chucks 115, 117.

Figure 16A:
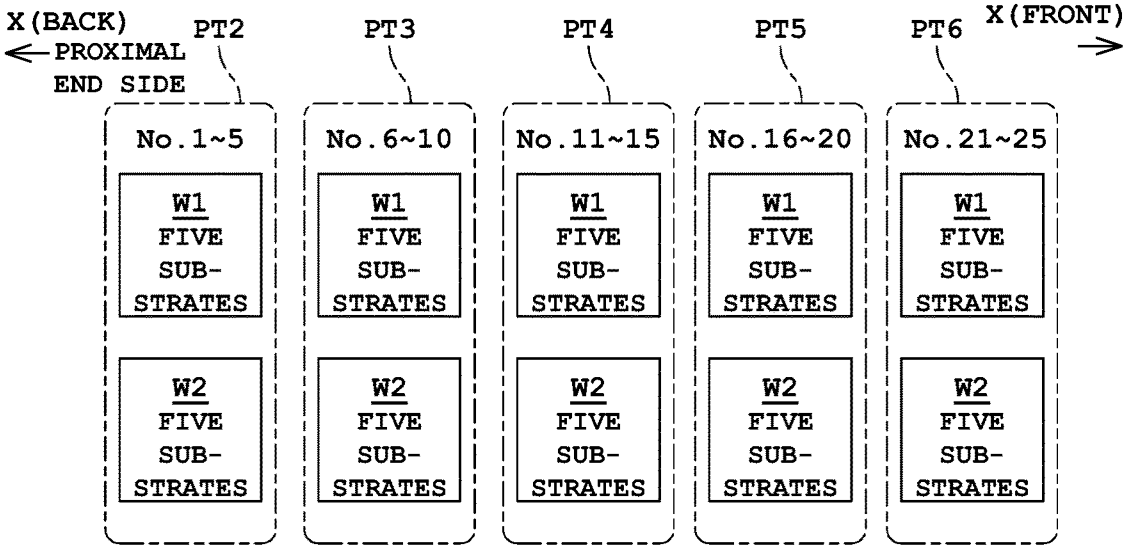
FIG. 16A illustrates assignment of six patterns.

Detailed description is further made of the two horizontal chucks 115, 117. FIG. 16A illustrates assignment of the six patterns PT1 to PT6. It is assumed that fifty substrates W are arranged in a face-to-face system and at a half pitch. Twenty-five substrates W1 are numbered No. 1, No. 2, No. 3 to No. 25 from a proximal end side of each of the horizontal chucks 115, 117.

When the patterns PT1 are used, all the fifty substrates W pass through. The patterns PT1 each have passing grooves (passing portions) 121 formed in positions corresponding to the fifty substrates W. Here, it is now assumed to be under a condition shown in FIG. 11C. When the two patterns PT1 of the two horizontal chucks 115, 117 face to each other, i.e., when the two horizontal chucks 115, 117 have the pattern PT1, the second transport mechanism WTR2 does not hold all the substrates W.

Figure 16B:
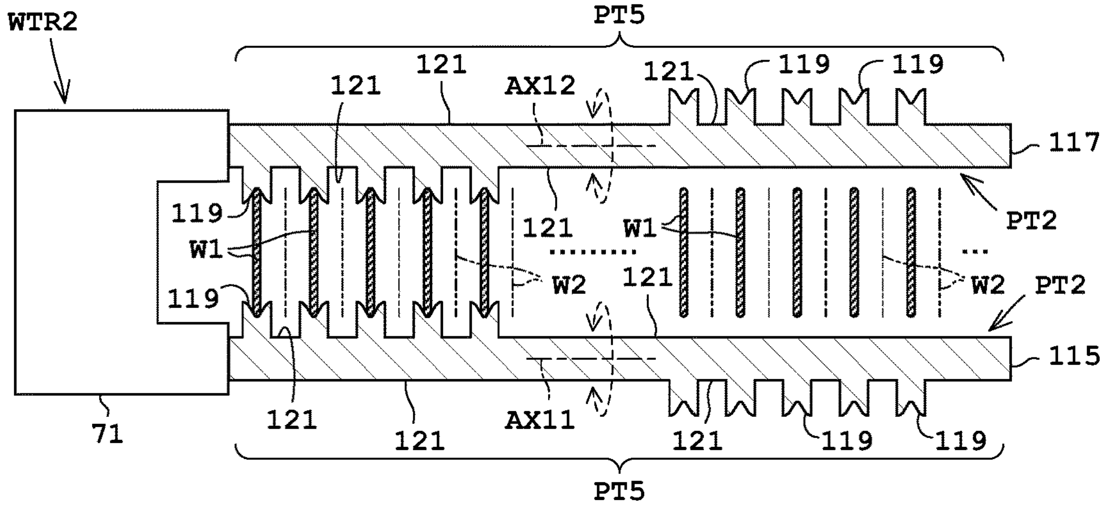
FIG. 16B illustrates operation of the second transport mechanism when two predetermined patterns face each other.

When the patterns PT2 are used, five substrates W1 of No. 1 to No. 5 are pulled out. The patterns PT2 each have five holding grooves 119, as shown in FIG. 16B, which positions correspond to the five substrates W1 of No. 1 to No. 5. Moreover, the patterns PT2 each have passing grooves 121 at other positions that correspond to substrates W1, W2 except for the five substrates W1 of No. 1 to No. 5. That is, no holding grooves 119 are provided at the other positions. Here, it is now assumed to be under a condition shown in FIG. 11C. When the two horizontal chucks 115, 117 use the patterns PT2, the second transport mechanism WTR2 pulls out the five substrates W1 (No. 1 to No. 5) set in advance from the fifty substrates W.

When the patterns PT3 are used, five substrates W1 of No. 6 to No. 10 are pulled out. The patterns PT3 each have five holding grooves 119 at positions that correspond to the five substrates W1 of No. 6 to No. 10. Moreover, the patterns PT3 each have passing grooves 121 at other positions that correspond to substrates W1, W2 except for the five substrates W1 of No. 1 to No. 5. That is, no holding grooves 119 are provided at the other positions. Here, it is now assumed to be under a condition shown in FIG. 11C. When the two horizontal chucks 115, 117 use the patterns PT3, the second transport mechanism WTR2 pulls out the five substrates W1 of No. 6 to No. 10 from the fifty substrates W.

The patterns PT4 each have five holding grooves 119 at positions that correspond to five substrates W1 of No. 11 to No. 15, but has no holding grooves 119 at other positions. In a condition illustrated in FIG. 11C, when the two horizontal chucks 115, 117 use the patterns PT4, the second transport mechanism WTR2 pulls out the five substrates W1 of No. 11 to No. 15 from the fifty substrates W.

Figure 16C:
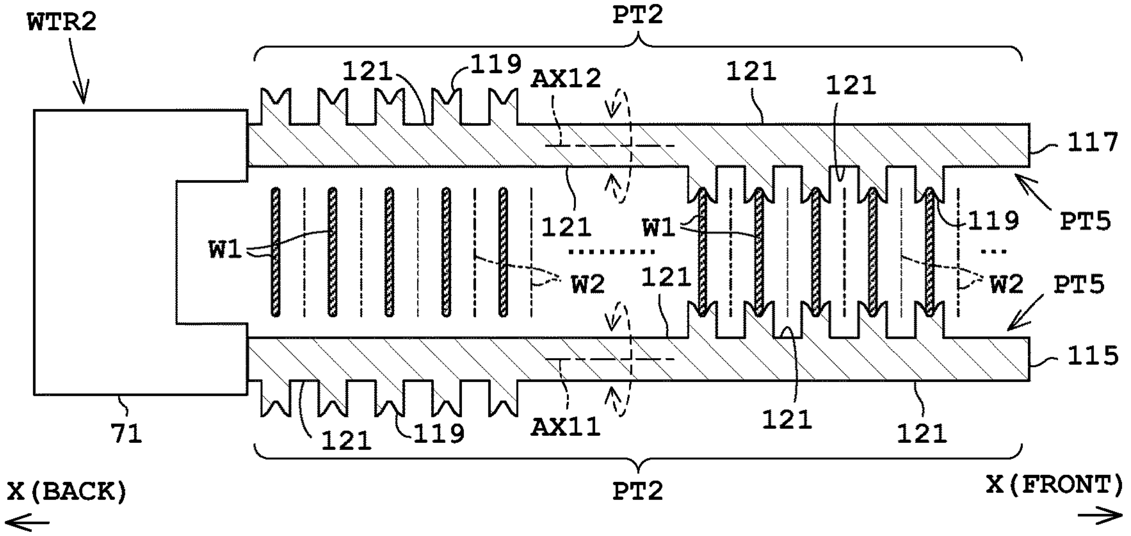
FIG. 16C illustrates operation of the second transport mechanism when other two patterns face each other.

As illustrated in FIG. 16C, the patterns PT5 each have five holding grooves 119 at positions that correspond to five substrates W1 of No. 16 to No. 20, but has no holding grooves 119 at other positions. In the condition illustrated in FIG. 11C, when the two horizontal chucks 115, 117 use the patterns PT5, the second transport mechanism WTR2 pulls out the five substrates W1 of No. 16 to No. 20 from the fifty substrates W. The five substrates W1 of No. 16 to No. 20 are different from the substrates W1 pulled out with the other five pairs of patterns PT1 to PT4 and PT6.

The patterns PT6 each have five holding grooves 119 at positions that correspond to five substrates W1 of No. 21 to No. 25, but has no holding grooves 119 at other positions. In the condition illustrated in FIG. 11C, when the two horizontal chucks 115, 117 use the patterns PT6, the second transport mechanism WTR2 pulls out the five substrates W1 of No. 21 to No. 25 from the fifty substrates W.

Here, when the substrates W2 in the second substrate group are pulled out, a lifting and rotating portion 67 of a pusher mechanism 61 rotates twenty-five substrates W2, held by the pusher 65, by 180 degrees around the vertical axis AX4. Such 180-degree rotation can move positions of the substrates W2 rearward X at a half pitch from those before the rotation.

It should be noted that the six patterns PT1 to PT6 are not limited to the above example. For example, the following setting is applicable. When the patterns PT2 are used, ten substrates W1 (W2) of No. 1 to No. 10 are set to be pulled out. When the patterns PT3 are used, ten substrates W1 (W2) of No. 11 to No. 20 are set to be pulled out. When the patterns PT4 are used, five substrates W1 (W2) of No. 21 to No. 25 are set to be pulled out. When the three other patterns PT1, PTS, PT6 are used, all the substrates W (W1, W2) are set not to be pulled out.

With this embodiment, the second transport mechanism WTR2 can pull out and transport substrates W1 (W2), different in pattern with which the substrates W1 (W2) are pulled out, from the substrates W held by the pusher 65. For example, when the patterns PT2 are used, five substrates W1 of No. 1 to No. 5 can be pulled out. Moreover, when the patterns PT5 are used, five substrates W1 of No. 16 to No. 20 can be pulled out.

This invention is not limited to the foregoing examples, but may be modified as follows.

(1) In the embodiments described above, the guide rail of the horizontally moving unit 41 of the center robot CR is provided on the floor of the single-wafer transportation region R2. Instead of this, as illustrated in FIG. 17, a guide rail 41A of the horizontally moving unit 41 of the center robot CR may be provided in an upper part of the single-wafer transportation region R2, and the lifting and rotating portion 39 and the like of the center robot CR may be suspended on the guide rail 41A reversely.

The center robot CR includes a mechanism body 123 (two hands 35A, 35B, advancing and withdrawing portion 37, lifting and rotating portion 39), and the horizontally moving unit 41. The horizontally moving unit 41 includes the guide rail 41A, a slider 41B, a threaded shaft, and an electric motor, for example. The guide rail 41A is provided in the upper part of the single-wafer transportation region R2 in the front-back direction X along the single-wafer transportation region R2. Specifically, the guide rail 41A is provided on a ceiling 125 or its surroundings of the single-wafer transportation region R2 (or treating block 7). Here, the guide rail 41A corresponds to an upper rail in the present invention.

The mechanism body 123 is suspended on the guide rail 41A, and moves in the front-back direction X along the guide rail 41A. This prevents contamination of the advancing and withdrawing portion 37 and the lifting and rotating portion 39, for example, due to falling of droplets from wet substrates W. For example, contamination of the advancing and withdrawing portion 37 and the like with the droplets, which may cause failure of the center robot CR, can be prevented.

Figure 17:
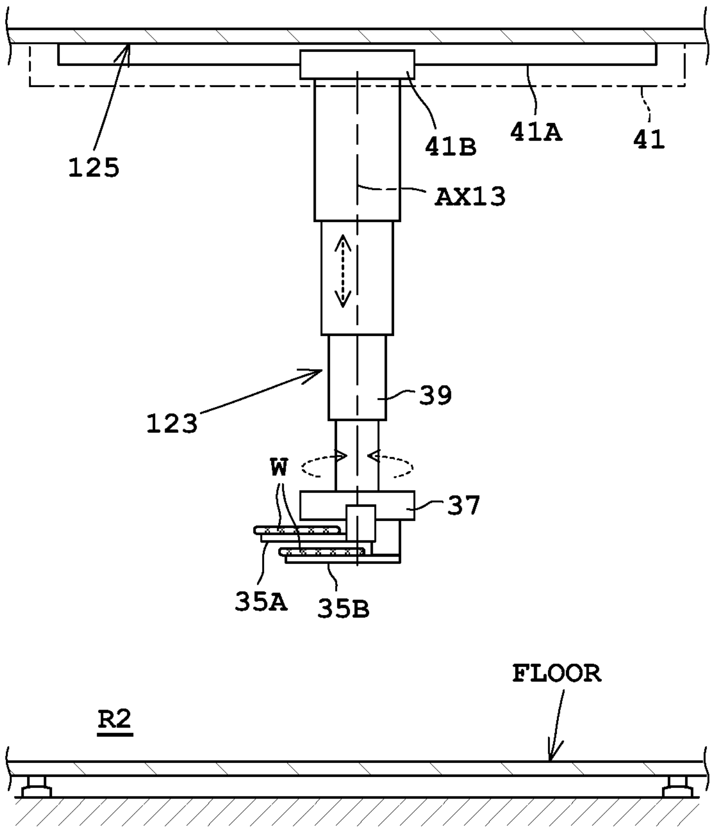
FIG. 17 is a side view of a ceiling-suspended center robot according to one modification.

When the first hand 35A is provided higher than the second hand 35B as shown in FIG. 17, the first hand 35A is used for transporting substrates W, on which the dry treatment is performed, whereas the second hand 35B is used for transporting wet substrates W from the second posture turning mechanism 31 to either the single-wafer processing chamber SW3 or SW4.

(2) In the embodiments and the modification described above, the single-wafer processing chambers SW3, SW4 each perform the dry treatment on substrates W with supercritical fluid. In this regard, the single-wafer processing chambers SW3, SW4 may each include a rotating unit 45 and a nozzle 47 like the single-wafer processing chambers SW1, SW2. In this case, the single-wafer processing chambers SW1 to SW4 each supply deionized water and IPA to substrates W in this order, and then perform dry treatment (spin drying) on the substrates W.

(3) In the embodiments and the modifications described above, the batch process tanks BT1 to BT6 each perform treatment on fifty substrates W arranged in a face-to-face system and at a half pitch. However, the batch process tanks BT1 to BT6 may each perform treatment on substrates W arranged in a face-to-back system where device faces of the substrates W are all directed to the same direction. The batch process tanks BT1 to BT6 may each perform treatment on twenty-five substrates W for one carrier C arranged at a full pitch. When fifty substrates W are arranged in the face-to-back system in FIG. 11B, the opening and closing portion 71 moves the two chucks 69, 70 in the front-back direction X where the substrates W are aligned, whereby twenty-five substrates W1 or twenty-five substrates W2 are pulled out.

Figure 18:
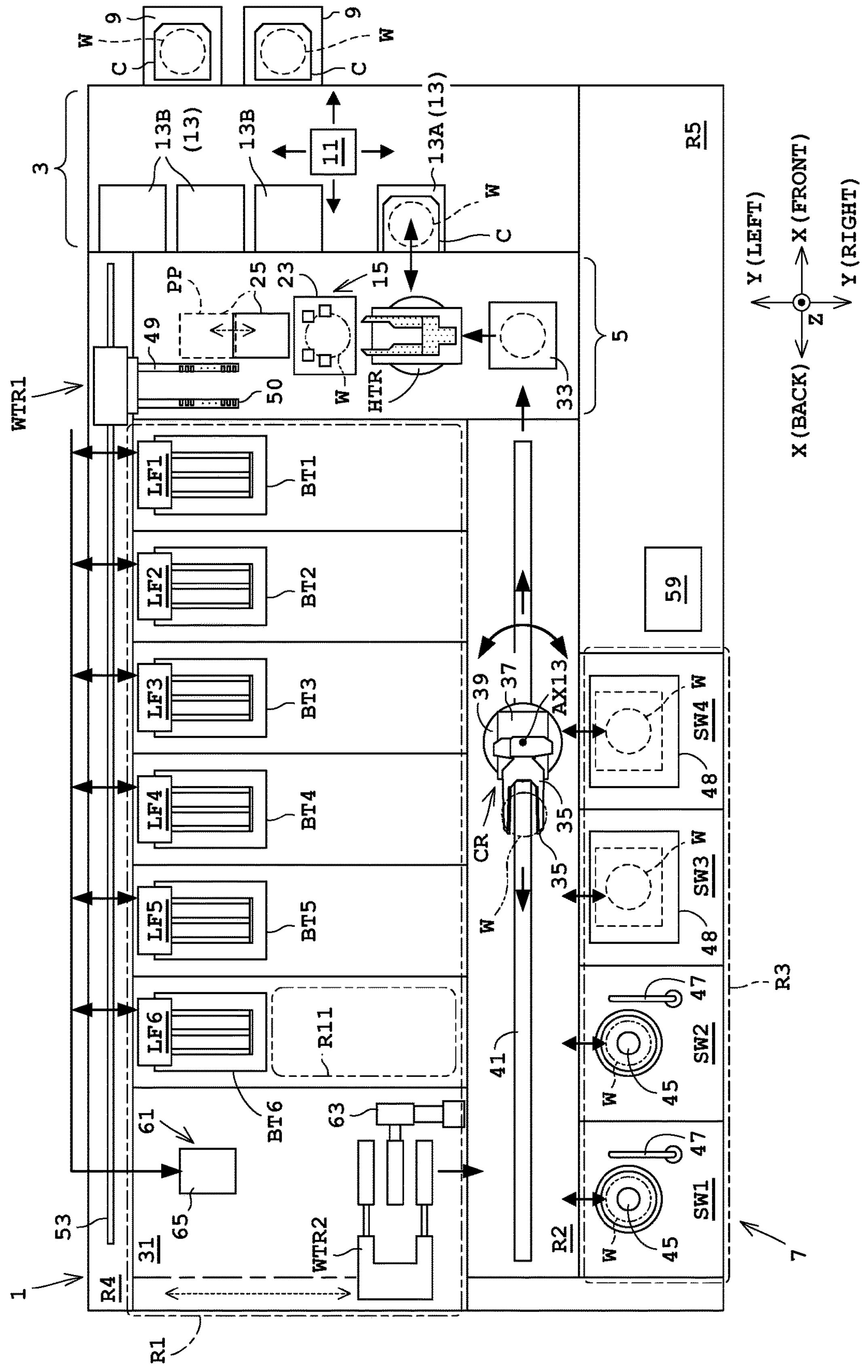
FIG. 18 is a plan view schematically illustrating a configuration of a substrate treating apparatus according to the modification.

(4) In the embodiments and the modifications described above, the batch treatment region R1 may be elongated in the transverse direction Y. For example, a pipe for supplying deionized water and the like to the batch process tank BT6 and a pipe for exhausting liquid in the batch process tank BT6 are provided in a region R11, rightward Y of the batch process tank BT6, shown by chain double-dashed lines in FIG. 18. Accordingly, when the pipes in the region 11 is complicated in construction, the batch treatment region R1 is elongated in the transverse direction Y. Since the posture turning unit 63 of the second posture turning mechanism 31 is provided adjacent to the single-wafer transportation region R2, the center robot CR can easily access the posture turning unit 63.

Moreover, the second posture turning mechanism 31 may be provided over the batch treatment region R1. For example, the second posture turning mechanism 31 may be provided so as to enter the single-wafer transportation region R2. Here in FIG. 18, the buffer unit 33 is provided in the transferring block 5.

(5) In the embodiments and the modifications described above, when the second transport mechanism WTR2 transports substrates W from the pusher mechanism 61, the lifting member 73 moves the chucks 69, 70 upward and downward, whereby the second transport mechanism WTR2 receives the substrates W. In this regard, the second transport mechanism WTR2 may receive the substrates W from the pusher mechanism 61 by moving the pusher 65, holding the substrates W in the vertical posture, upward and downward by the lifting and rotating portion 67 of the pusher mechanism 61. Moreover, the second transport mechanism WTR2 may receive the substrates W from the pusher mechanism 61 by moving the chucks 69, 70 upward by the lifting member 73 and moving the pusher 65 downward by the lifting and rotating portion 67.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for successively performing batch treatment for processing a plurality of substrates collectively and single-wafer treatment for processing the plurality of substrates one by one, the substrate treating apparatus comprising:

a batch process tank configured to perform treatment on the plurality of substrates collectively;

a first batch substrate transport mechanism configured to transport the plurality of substrates in a vertical posture collectively to the batch process tank, wherein in said vertical posture each of the plurality of substrates stands in a vertical posture while all the plurality of substrates are arranged in a horizontal direction;

a single-wafer processing chamber configured to perform treatment on the plurality of substrates one by one;

a single-wafer transport mechanism configured to transport the plurality of substrates in a horizontal posture one by one to the single-wafer processing chamber, wherein in said horizontal posture each of the plurality of substrates is in a horizontal posture while all the plurality of substrates are arranged in a vertical direction, and a posture turning mechanism configured to turn a posture of the plurality of substrates in the vertical posture, on which the batch treatment is performed, to the horizontal posture, the posture turning mechanism including:

a substrate holder provided at a position accessible by the first batch substrate transport mechanism and configured to receive and hold the plurality of substrates in the vertical posture, on which the batch treatment is performed, from the first batch substrate transport mechanism collectively, a posture turning unit provided at a position accessible by the single-wafer transport mechanism and configured to turn the plurality of substrates from the vertical posture to the horizontal posture collectively, and a second batch substrate transport mechanism configured to move between the substrate holder and the posture turning unit and configured to receive the plurality of substrates in the vertical posture held by the substrate holder and deliver the plurality of substrates to the posture turning unit, the second batch substrate transport mechanism including:

two horizontal chucks configured to hold the plurality of substrates in the vertical posture while radially supporting two lateral side portions on an outer edge of each of the plurality of substrates in the vertical posture held by the substrate holder, the posture turning unit including:

an upper chuck and a lower chuck configured to radially support an upper portion and a lower portion on the outer edge of each of the plurality of substrates in the vertical posture held by the two horizontal chucks and configured to receive the plurality of substrates in the vertical posture from the two horizontal chucks, and an upper and lower chuck rotation unit configured to rotate the upper chuck and the lower chuck around a horizontal axis orthogonal to an alignment direction of the plurality of substrates held by the upper chuck and the lower chuck for turning the plurality of substrates received from the two horizontal chucks from the vertical posture to the horizontal posture, wherein the single-wafer transport mechanism takes the plurality of substrates, held by the upper chuck and the lower chuck, in the horizontal posture one by one, and transports the plurality of substrates to the single-wafer processing chamber.

2. The substrate treating apparatus according to claim 1, wherein the two horizontal chucks, each has a plurality of first V-shaped holding grooves for holding the plurality of substrates in the vertical posture individually, the upper chuck has a plurality of first horizontal guide grooves each having a width larger than a thickness of each of the plurality of substrates for housing the outer edge of each of the plurality of substrates, and the lower chuck has a plurality of second horizontal guide grooves each having a width larger than the thickness of each of the plurality of substrates for housing the outer edge of each of plurality of the substrates.

3. The substrate treating apparatus according to claim 2, wherein the posture turning unit further includes two auxiliary chucks provided on both sides of the lower chuck along a circumferential direction of the plurality of substrates, the two auxiliary chucks, each includes a plurality of second V-shaped holding grooves for holding the plurality of substrates in the vertical posture, the two auxiliary chucks, each houses the outer edges of the plurality of substrates in the second V-shaped holding grooves for holding the plurality of substrates in the vertical posture when the upper chuck and the lower chuck hold the plurality of substrates in the vertical posture, and the two auxiliary chucks, each takes the plurality of substrates from the second V-shaped holding grooves and moves apart from the plurality of substrates to a position where the single-wafer transport mechanism is not prevented from taking of the plurality of substrates when the upper chuck and the lower chuck hold the plurality of substrates in the horizontal posture.

4. The substrate treating apparatus according to claim 3, wherein the posture turning unit further includes a relative moving unit configured to move the two auxiliary chucks relatively to the upper chuck and the lower chuck in the alignment direction where the plurality of substrates are aligned, the first horizontal guide grooves have a plurality of mounting surfaces on which the plurality of substrates in the horizontal posture are placed individually, and when the posture turning unit turns the plurality of substrates to the horizontal posture, the relative moving unit moves the two auxiliary chucks relatively such that the plurality of substrates in the vertical posture held by the second V-shaped holding grooves are brought into contact to the mounting surfaces individually.

5. The substrate treating apparatus according to claim 1, wherein the posture turning mechanism further includes a stand-by tank configured to store a liquid in which the plurality of substrates held by the substrate holder is immersed.

6. The substrate treating apparatus according to claim 1, wherein the posture turning mechanism further includes a holder nozzle configured to supply a liquid in a shower state or in a mist state to the plurality of substrates held by the substrate holder.

7. The substrate treating apparatus according to claim 1, wherein the posture turning mechanism further includes a posture turning nozzle configured to supply a liquid in a shower state or in a mist state to the plurality of substrates held by the upper chuck and the lower chuck of the posture turning unit.

8. The substrate treating apparatus according to claim 1, wherein the posture turning mechanism further includes a rotator configured to rotate the substrate holder around a vertical axis.

9. The substrate treating apparatus according to claim 8, wherein the batch process tank and the posture turning mechanism are arranged in a first horizontal direction, and the second batch substrate transport mechanism transports the plurality of substrates from the substrate holder in a second horizontal direction orthogonal to the first horizontal direction.

10. The substrate treating apparatus according to claim 1, wherein the two horizontal chucks are each provided with two or more V-shaped holding grooves configured to hold two or more substrates, set in advance, from the plurality of substrates, and the second batch substrate transport mechanism pulls out the two or more substrates from the plurality of substrates in the vertical posture held by the substrate holder with use of the two horizontal chucks.

11. The substrate treating apparatus according to claim 1, wherein the second batch substrate transport mechanism is configured to switch the two horizontal chucks between a first pattern and a second pattern, when the two horizontal chucks have the first pattern, the second batch substrate transport mechanism pulls out one or more substrates, set in advance, from the plurality of substrates in the vertical posture held by the substrate holder, and when the two horizontal chucks have the second pattern, the second batch substrate transport mechanism pulls out one or more substrates, set in advance and different from the one or more substrates pulled out with the first pattern, from the plurality of substrates in the vertical posture held by the substrate holder.

* * * * *